(12) United States Patent
Robustelli et al.

(10) Patent No.: US 11,302,390 B2
(45) Date of Patent: Apr. 12, 2022

(54) READING A MULTI-LEVEL MEMORY CELL

(71) Applicant: Micron Technology, Inc., Boise, ID (US)

(72) Inventors: Mattia Robustelli, Milan (IT); Fabio Pellizzer, Boise, ID (US); Innocenzo Tortorelli, Cernusco sul Naviglio (IT); Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/926,557

(22) Filed: Jul. 10, 2020

(65) Prior Publication Data

US 2022/0013167 A1    Jan. 13, 2022

(51) Int. Cl.
*G11C 11/56* (2006.01)
*G11C 7/10* (2006.01)

(52) U.S. Cl.
CPC .......... *G11C 11/56* (2013.01); *G11C 7/1051* (2013.01); *G11C 7/1096* (2013.01)

(58) Field of Classification Search
CPC ...... G11C 11/56; G11C 7/1051; G11C 7/1096
See application file for complete search history.

(56) References Cited

U.S. PATENT DOCUMENTS

| | | | | |
|---|---|---|---|---|
| 7,180,767 B2* | 2/2007 | Chen | ............. | G11C 11/56 365/148 |
| 8,081,501 B2* | 12/2011 | Choi | ............. | G11C 8/10 365/148 |
| 8,605,495 B2* | 12/2013 | Lung | ............. | H01L 45/148 365/163 |
| 9,799,381 B1 | 10/2017 | Tortorelli et al. | | |
| 10,431,301 B2 | 10/2019 | Mirichigni et al. | | |
| 10,566,052 B2 | 2/2020 | Mirichigni et al. | | |
| 10,755,781 B2* | 8/2020 | Robustelli | .......... | G11C 13/0069 |
| 10,991,424 B2* | 4/2021 | Lee | ............. | G11C 13/004 |
| 11,043,268 B2* | 6/2021 | Baek | ............. | G11C 13/0064 |
| 2006/0227591 A1* | 10/2006 | Lowrey | ............. | G11C 16/3431 365/148 |
| 2014/0372674 A1 | 12/2014 | Kim et al. | | |
| 2015/0019934 A1 | 1/2015 | Chae | | |
| 2016/0111150 A1 | 4/2016 | Bazarsky et al. | | |

(Continued)

OTHER PUBLICATIONS

PCT Application No. PCT/IB2019/001203, by Di Vincenzo et al., filed Dec. 3, 2019 (63 pages).

(Continued)

*Primary Examiner* — Vanthu T Nguyen
(74) *Attorney, Agent, or Firm* — Holland & Hart LLP

(57) ABSTRACT

Methods, systems, and devices for reading a multi-level memory cell are described. The memory cell may be configured to store three or more logic states. The memory device may apply a first read voltage to a memory cell to determine a logic state stored by the memory cell. The memory device may determine whether a first snapback event occurred and apply a second read voltage based on determining that the first snapback event failed to occur based on applying the first read voltage. The memory device may determine whether a second snapback event occurred and determine the logic state based on whether the first snapback event or the second snapback event occurred.

22 Claims, 10 Drawing Sheets

(56) References Cited

U.S. PATENT DOCUMENTS

2017/0345503 A1 11/2017 Kim et al.
2019/0378568 A1 12/2019 Robustelli
2020/0219562 A1 7/2020 Hirst et al.

OTHER PUBLICATIONS

PCT Application No. PCT/IB2019/001204, by Di Vincenzo et al., filed Dec. 3, 2019 (62 pages).
ISA/KR, International Search Report and Written Opinion of the International Searching Authority, Int'l Appl. No. PCT/US2021/039539, Oct. 15, 2021, Korean Intellectual Property Office, Seo-gu, Daejeon, Republic of Korea, 9 pgs.

* cited by examiner

READING A MULTI-LEVEL MEMORY CELL

BACKGROUND

The following relates generally to one or more systems for memory and more specifically to reading a multi-level memory cell.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, or reducing manufacturing costs, among other metrics. Storing multiple bits of information in a memory cell may be desired to increase a data storage density without increasing a physical memory cell density.

DETAILED DESCRIPTION

Figure 1:
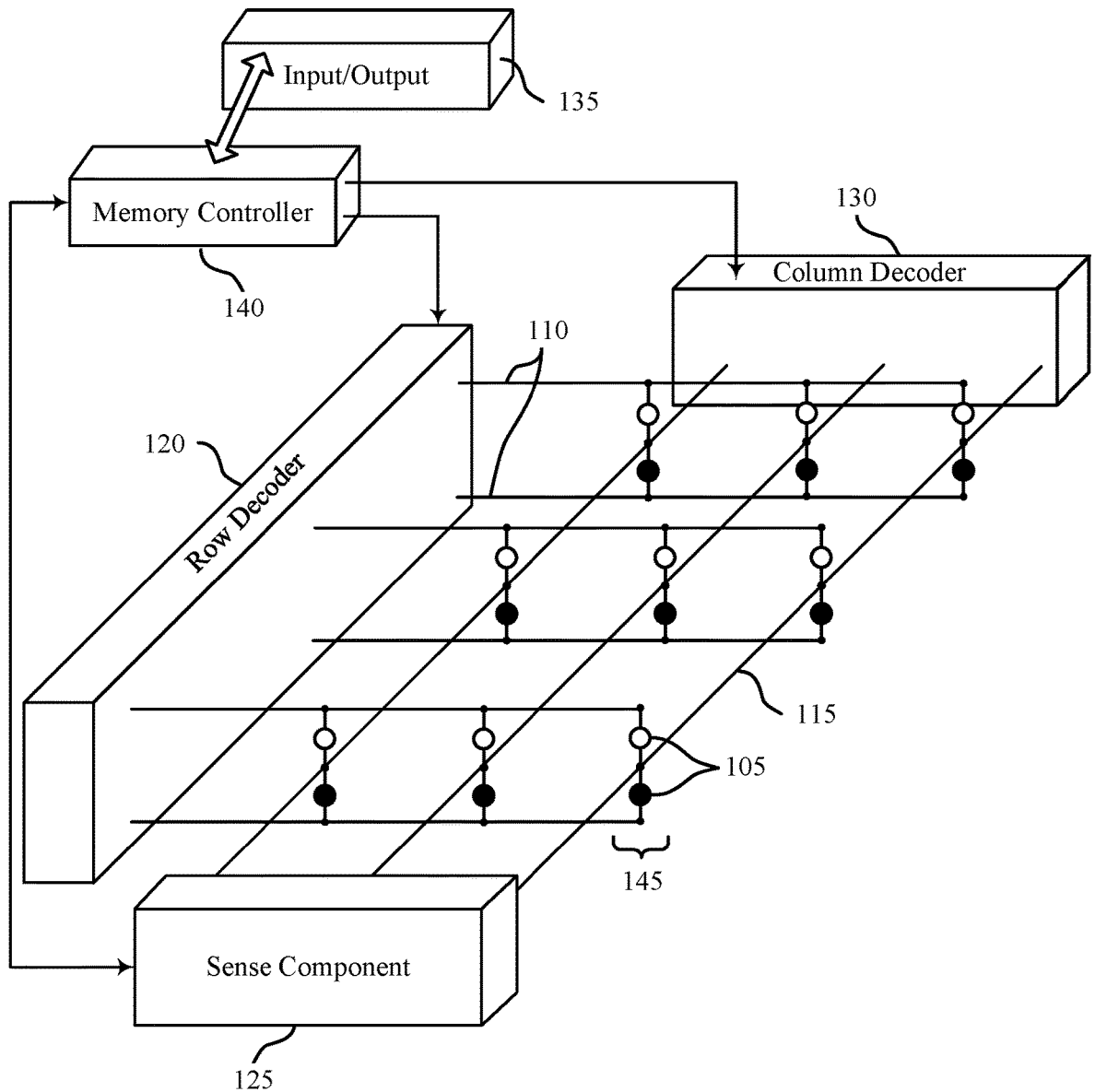
FIG. 1 illustrates an example memory device that supports reading a multi-level memory cell in accordance with examples as disclosed herein.

A self-selecting memory cell including a chalcogenide material may be an example of a multi-level cell that is configured to store three or more unique states. As such, a single multi-level self-selecting memory cell may be configured to store more than one bit of data. In some cases, a self-selecting memory cell may be selected by applying a bias between a word line and a digit line. The logic state that is stored in a self-selecting memory cell may be based on a polarity of a programming pulse applied to the self-selecting memory cell. For some multi-level self-selecting memory cells, to program one or more intermediate memory states to the self-selecting memory cell, a programming pulse sequence that includes two pulses may be used. A first pulse of the programming pulse sequence may have a first polarity and a first magnitude and the second pulse of the programming pulse sequence may have a second polarity different than the first polarity and a second magnitude different than the first magnitude. After applying both pulses in the programming pulse sequence, the self-selecting memory cell may store an intermediate state that represents two bits of data (e.g., a logic '01' or a logic '10').

Devices, systems, and techniques are described for reading a multi-level self-selecting memory cell that stores three or more states. To read one or more memory states of the self-selecting memory cell, two or more read voltages are sequentially applied to the memory cell. For example, a first read voltage may be applied, and if the first read voltage does not result in a snapback event occurring, a second read voltage may be applied to the memory cell as part of the read operation. In some examples, if the second read voltage does not result in a snapback event occur, a third read voltage may be applied to the memory cell as part of the read operation.

Some logic states capable of being stored by the memory cell may be disturbed by applying the read voltage (e.g., first read voltage, second read voltage, or third read voltage). In such cases, the memory cell may be reprogrammed after the read operation. In some cases, different read schemes may use different polarities of read voltages to mitigate the use of a reprogramming operation after the read operation. Reading one or more memory states of the self-selecting memory cell by applying two or more read voltages sequentially may result in less disturbance of the programmed state.

Features of the disclosure are initially described in the context of a memory array and systems as described with reference to FIGS. 1-2. Features of the disclosure are described in the context of diagrams showing distributions of threshold voltages, flowcharts, and timing diagrams as described with reference to FIGS. 3-7. These and other features of the disclosure are further illustrated by and described with reference to an apparatus diagram and flowcharts that relate to reading a multi-level memory cell as described with reference to FIGS. 8-10.

FIG. 1 illustrates an example memory device 100 that supports reading a multi-level memory cell in accordance with examples as disclosed herein. Memory device 100 may also be referred to as an electronic memory apparatus. In some cases, The components and features of the memory device 100 are shown to illustrate functional interrelationships, and not their actual physical positions within the memory device 100. In the illustrative example of FIG. 1, the memory device 100 includes a three-dimensional (3D) memory array. The memory array includes memory cells 105 that may be programmable to store different states. In some examples, each memory cell 105 may be programmable to store two states, denoted as a logic 0 and a logic 1. In some examples, a memory cell 105 may be configured to store more than two logic states. A memory cell 105 may, in some examples, include a self-selecting memory cell. Although some elements included in FIG. 1 are labeled with a numeric indicator, other corresponding elements are not labeled, though they are the same or would be understood to be similar, in an effort to increase visibility and clarity of the depicted features.

The 3D memory array may include two or more two-dimensional (2D) memory arrays formed on top of one another. This may increase a quantity of memory cells that may be placed or created on a single die or substrate as compared with 2D arrays, which in turn may reduce production costs, or increase the performance of the memory device, or both. Based on the example depicted in FIG. 1, memory array includes two levels of memory cells 105 and may thus be considered a 3D memory array; however, the quantity of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple self-selecting memory cells laid on top of another while sharing an access line for both as explained below. In some cases, the self-selecting memory cells may be multi-level self-selecting memory cells configured to store more than one bit of data using multi-level storage techniques.

In some examples, each row of memory cells 105 is connected to an access line 110, and each column of memory cells 105 is connected to a bit line 115. Access lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third material may share an access line 110 with a lower material. In general, one memory cell 105 may be located at the intersection of two conductive lines such as an access line 110 and a bit line 115. This intersection may be referred to as a memory cell's address. A target memory cell 105 may be a memory cell 105 located at the intersection of an energized access line 110 and bit line 115; that is, access line 110 and bit line 115 may be energized in order to read or write a memory cell 105 at their intersection. Other memory cells 105 that are in electronic communication with (e.g., connected to) the same access line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive material, or the like that provides a conductive path between elements or components of memory device 100. In some examples, a memory cell 105 may include a chalcogenide material positioned between a first electrode and a second electrode. One side of the first electrode may be coupled to an access line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting access line 110 and digit line 115. In some examples, access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. Thus, by activating a word line 110 and a digit line 115, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. The sense component may be associated either with column decoder or row decoder without losing its functional purposes.

A memory cell 105 may be set or written by similarly activating the relevant word line 110 and digit line 115 and at least one logic value may be stored in the memory cell 105. Column decoder 130 or row decoder 120 may accept data, for example input/output 135, to be written to the memory cells 105. In the case of a self-selecting memory cell including a chalcogenide material, a memory cell 105 may be written to store data by applying a programming sequence including a first pulse having a first polarity and a second pulse having a second polarity. The programming pulse may have various shapes. This process is discussed in more detail below with reference to FIGS. 3A, 3B, 4A, 4B, 5A and 5B.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100.

The memory controller 140 may be configured to execute a write operation that can program a self-selecting memory cell with more than two states. For example, the memory controller 140 may be configured to program the self-selecting memory cell with four states (e.g., a logic '00', a logic '01', a logic '10', or a logic '11'). In some cases, two or more read voltages may be sequentially applied to read one or more memory states of the self-selecting memory cell. A first read voltage may be applied with a first polarity and a second read voltage may be applied with a second polarity. In some cases, the first polarity and the second polarity may be the same. In other examples, the first polarity and the second polarity may be different.

For example, the memory controller 140 may apply the first read voltage to the self-selecting memory cell to determine a logic state stored by the self-selecting memory cell configured to store three or more logic states. The memory controller 140 may then determine whether a snapback event occurred after applying the first read voltage. For example, the memory controller 140 may determine that the snapback event failed to occur. In such cases, the memory controller 140 may then apply the second read voltage to the self-selecting memory cell. The memory controller 140 may determine whether a snapback event occurred after applying the second read voltage and determine the logic state stored by the memory cell based on determining whether either of the two snapback events occurred.

In some examples, the memory controller 140 may determine that the snapback event failed to occur after applying the second read voltage. In such cases, the memory controller 140 may then apply a third read voltage to the self-selecting memory cell. The memory controller 140 may determine whether a snapback event occurred after applying the third read voltage and determine the logic state stored by the memory cell based on determining whether either of the three snapback events occurred.

Figure 2:
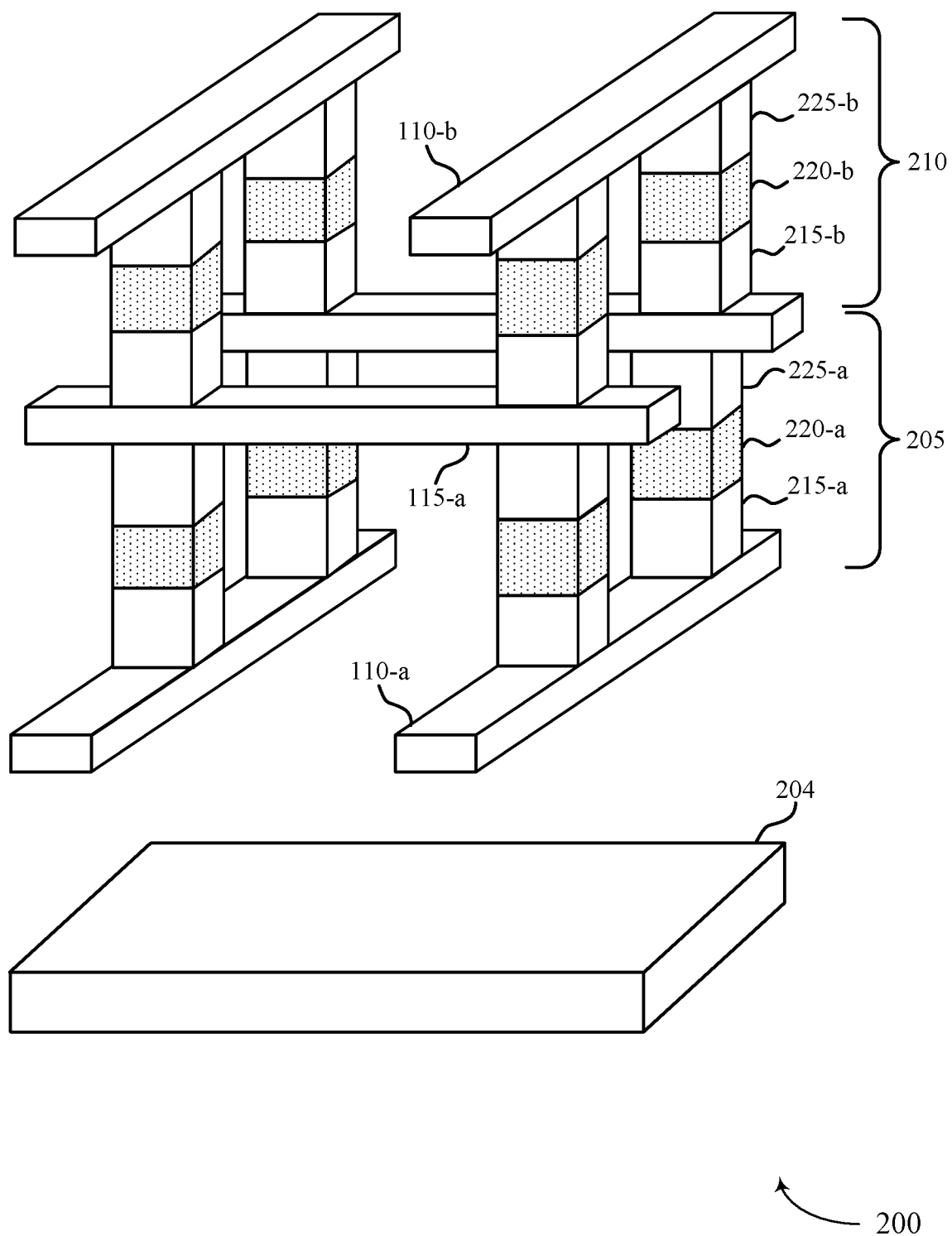
FIG. 2 illustrates an example of a memory array that supports reading a multi-level memory cell in accordance with examples as disclosed herein.

FIG. 2 illustrates an example of a memory array 200 that supports reading a multi-level memory cell in accordance with examples as disclosed herein. Memory array 200 may be an example of portions of memory array described with reference to FIG. 1. Memory array 200 may include a first array or deck 205 of memory cells that is positioned above a substrate 204 and second array or deck 210 of memory cells on top of the first array or deck 205. Memory array 200 may also include word line 110-$a$ and word line 110-$b$, and bit line 115-$a$, which may be examples of word line 110 and bit line 115, as described with reference to FIG. 1. Memory cells of the first deck 205 and the second deck 210 each may have one or more self-selecting memory cell. Although some elements included in FIG. 2 are labeled with a numeric indicator, other corresponding elements are not labeled, though they are the same or would be understood to be similar, in an effort to increase visibility and clarity of the depicted features.

Self-selecting memory cells of the first deck 205 may include first electrode 215-$a$, chalcogenide material 220-$a$, and second electrode 225-$a$. In addition, self-selecting memory cells of the second deck 210 may include a first electrode 215-$b$, chalcogenide material 220-$b$, and second electrode 225-$b$. The self-selecting memory cells of the first deck 205 and second deck 210 may, in some examples, have common conductive lines such that corresponding self-selecting memory cells of each deck 205 and 210 may share bit lines 115 or word lines 110 as described with reference to FIG. 1. For example, first electrode 215-$b$ of the second deck 210 and the second electrode 225-$a$ of the first deck 205 may be coupled to bit line 115-$a$ such that bit line 115-$a$ is shared by vertically adjacent self-selecting memory cells.

The architecture of memory array 200 may be referred to as a cross-point architecture in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

In some architectures (not shown), a plurality of word lines may be formed on parallel planes or tiers parallel to a substrate. The plurality of word lines may be configured to include a plurality of holes to allow a plurality of bit lines formed orthogonally to the planes of word lines such that each of the plurality of bit lines penetrates through a vertically aligned set of holes (e.g., the bit lines vertically disposed with respect to the planes of word lines and the horizontal substrate). Memory cells including storage element (e.g., self-selecting memory cells including a chalcogenide material) may be formed at the crossings of word lines and bit lines (e.g., spaces between the word lines and the bit line in the vertically aligned set of holes). In a similar fashion as described above with reference to FIG. 1, the memory cells (e.g., self-selecting memory cells including a chalcogenide material) may be operated (e.g., read and/or programmed) by selecting respective access lines (e.g., a bit line and a word line) and applying voltage or current pulses.

While the example of FIG. 2 shows two memory decks, other configurations are possible. In some examples, a single memory deck of self-selecting memory cells may be constructed above a substrate 204, which may be referred to as a two-dimensional memory. In some examples, a three or four memory decks of memory cells may be configured in a similar manner in a three-dimensional cross point architecture. In some examples, one or more of the memory decks may include self-selecting memory cells that include chalcogenide material 220. Chalcogenide material 220 may, for example, include a chalcogenide glass such as, for example, an alloy of selenium (Se), tellurium (Te), arsenic (As), antimony (Sb), carbon (C), germanium (Ge), and silicon (Si). In some examples, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms.

In some examples, a self-selecting memory cell including chalcogenide material 220 may be read by applying two or more read voltages to the self-selecting memory cell using a bit line 115 and a word line 110. In one example, a controller associated with a self-selecting memory cell may apply a first read voltage, and if the first read voltage does not result in a snapback event occurring, a second read voltage may be applied to the self-selecting memory cell as part of the read operation. In some examples, the controller associated with the self-selecting memory cell may apply a third read voltage to the self-selecting memory cell as part of the read operation if the second read voltage does not result in a snapback event.

Figure 3A:
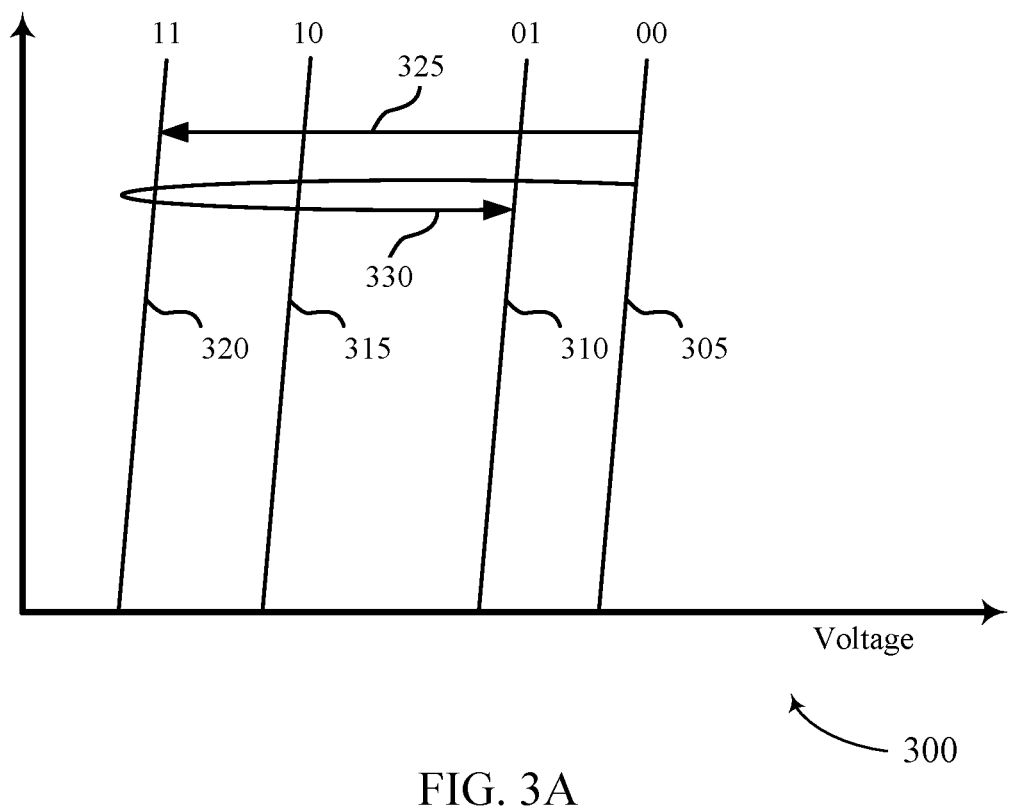
FIG. 3A illustrates an example of a diagram showing distributions of threshold voltages in a self-selecting memory cell that supports reading a multi-level memory cell in accordance with examples as disclosed herein.

FIG. 3A illustrates an example of a diagram 300 showing distributions of threshold voltages of a self-selecting memory cell that supports reading a multi-level memory cell in accordance with examples as disclosed herein. A multi-level self-selecting memory cell may be configured to store a logic state that represents multiple bits of data using a multi-level storage techniques. The voltage distributions depict logic states that may be read.

Self-selecting memory cells may include a chalcogenide material as described with reference to FIGS. 1 and 2. The threshold voltage distributions may represent a multi-level cell programming scheme for storing at least two-bits per cell. In the example of FIG. 3A, the distribution 305 may represent a logic state 00, the distribution 310 may represent a logic state 01, the distribution 315 may represent a logic state 10, and the distribution 320 may represent a logic state 11. In some cases, the distributions 305, 310, 315, and 320 may exhibit a median voltage value (such as a normal quantile) corresponding to a voltage distribution for each logic state. For example, the distribution 305 may represent a normal quantile for a distribution corresponding to logic state 00. Similarly, the distribution 310 may represent a normal quantile for a distribution corresponding to logic state 01, the distribution 315 may represent a normal quantile for a distribution corresponding to logic state 10, and the distribution 320 may represent a normal quantile for a distribution corresponding to logic state 11. In some examples, two distributions may have an overlapping portion, thus may not have clear separation between the two distributions. In some examples, each distribution may not be symmetrical around its median. In some examples, each distribution may exhibit a different ranges of voltage values. In some cases, two or more pulses may be used to write a logic state to a self-selecting memory cell. In some cases, two or more pulses may be used to read a logic state from the self-selecting memory cell.

Figure 3B:
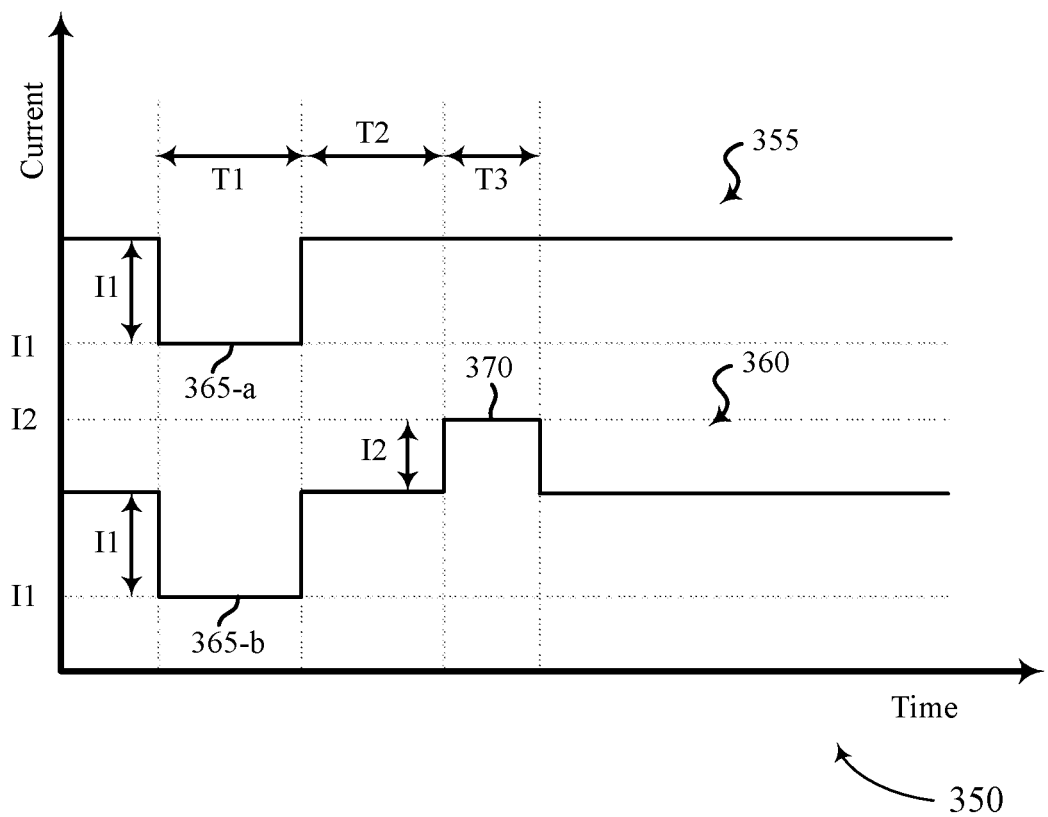
FIG. 3B illustrates an example of a timing diagram that supports reading a multi-level memory cell in accordance with examples as disclosed herein.

FIG. 3B illustrates an example of a timing diagram 350 that supports reading a multi-level memory cell in accordance with examples as disclosed herein. The timing diagram 350 shows a first pulse sequence 355 for programming a logic state '11' (e.g., distribution 320) and a second pulse sequence 360 for programming an intermediate logic state '01' (e.g., distribution 310). The pulse sequences 355, 360 may be used to program a multi-level self-selecting memory cell. In particular, the second pulse sequence 360 may be configured to store an intermediate state in the self-selecting memory device. The diagram 350 plots a magnitude of a current of one or more pulses (y-axis) applied to the self-selecting memory cells with respect to time (x-axis). In some cases, the voltage applied during programming a self-selecting memory cell may not correlate with an energy associated with a programming pulse. As a result, the voltage may be selected in a manner such that the voltage is sufficient to select the self-selecting memory cell regardless of a current state of the self-selecting memory cell. In some cases, the bias associated with a programming pulse may be increased if a default bias is not enough to select a high voltage associated with a self-selecting memory cell. In some examples, once a self-selecting memory cell is turned on, a bias across the active material of the self-selecting memory cell may be smaller than an external bias. In such cases, the bias may depend on one or more properties of the active material. As a result, controlling the pulse energy at a given pulse duration, may be controlled by a current flowing through the self-selecting memory cell. The current flowing through the self-selecting memory cell may be controlled using static configurations or dynamic configurations. In some cases, the current flowing in the self-selecting memory cell may be controlled using clamp devices or current mirrors.

A self-selecting memory cell with a chalcogenide material may be programmed with a first logic state upon receiving the first pulse sequence 355. The first pulse sequence 355 may include a pulse 365-$a$ with an amplitude corresponding to $I_1$ and a first polarity. The pulse 365-$a$ may be applied for a duration $T_1$ during which a fixed amplitude corresponding to $I_1$ is maintained. In some examples, the duration $T_1$ may range between few nano-seconds (nsec) up to a microsecond (μsec) long, e.g., 10 nsec to 1 μsec. The self-selecting memory cell may be programmed with a logic state 11 upon receiving the pulse 365-$a$. Using the first pulse sequence, regardless of the current state of the memory cell, the new state of the memory cell will be the logic state associated with the distribution 320. Arrow 325 of FIG. 3A shows the self-selecting memory cell going from the distribution 305 to the distribution 320 based on receiving the first pulse 365-$a$ during a write operation. In other examples, the pulse 365-$a$ will cause the self-selecting memory cell to go from the distribution 310 or the distribution 315 to the distribution 320.

The second pulse sequence 360 may be configured to program the self-selecting memory cell with an intermediate logic state with a threshold voltage distribution that lies between two other threshold voltage distributions. The second pulse sequence 360 may include the first pulse 365-$b$ and a second pulse 370. The first pulse 365-*b* may be similar in amplitude and polarity to pulse 365-*a*. The second pulse 370 may be configured to move the self-selecting memory cell from the distribution 320 to the distribution 310. The second pulse 370 may be a square pulse having a second polarity and a time duration $T_3$ during which a fixed amplitude corresponding to $I_2$ is maintained. In some cases, the second polarity of the second pulse 370 is different than the first polarity of the first pulse 365-*b*. This difference in polarity may cause the threshold voltage distribution of the self-selecting memory cell to move in a different direction than when the first pulse 365-*b* is applied.

In some cases, write operation for multi-level memory cells may exhibit large latencies because of detecting characteristics of the memory cell or finely tuning pulses applied to the memory cell. The second pulse sequence 360 is configured to provide a relative fast write operation for an intermediate level of the self-selected memory cell. In the second pulse sequence 360, the first pulse 365-*b* may be configured to move the self-selecting memory cell to an extreme distribution (e.g., distribution 320). Once there, the memory controller may have confidence in the current state of the self-selecting memory cell and apply the second pulse 370 to move the self-selecting memory cell to the desired intermediate distribution (e.g., distribution 310). Such a pulse sequence may avoid having a plurality of different pulse sequences for every combination of current state and desired state of the self-selecting memory cell.

As shown in the timing diagram 350, the first pulse 365-*b* may be applied for the first duration T1 and the second pulse 370 may be applied sometime after the first pulse 365-*b* for a duration T3. Arrow 330 of FIG. 3A shows the self-selecting memory cell going from the distribution 305 to the distribution 320 based on receiving the first pulse 365-*b* during a write operation and then going from the distribution 320 to the distribution 310 based on receiving the second pulse 370 during the write operation. In other examples, the pulse 365-*b* will cause the self-selecting memory cell to go from the distribution 310 or the distribution 315 to the distribution 320. The duration $T_3$ may occur after the duration $T_1$. In some cases, the pulse sequence 360 may include a gap time where the self-selecting memory cell may be biased to a zero voltage level or a ground voltage, during a duration $T_2$. The gap time may occur between the duration $T_1$ and the duration $T_3$. In some examples, there is no gap time between applying the first pulse 365-*b* and the second pulse 370. In such cases, the second pulse 370 may be applied immediately after the first voltage pulse is applied.

Although the pulses are depicted in the diagram 350 as square pulses, it should be appreciated that various shapes of programming pulses may be applied to self-selecting memory devices without losing functionality. For example, programming pulses may be square pulses, rectangular pulses, ramp pulses, or a combination thereof.

In some examples, the second pulse sequence 360 may be replaced by a sequence of programming pulses including a verify. As previously described, the verify may be a read voltage corresponding to a desired logic state for at least one bit. In the example of FIGS. 3A and 3B, the desired state may be at an intermediate logic state of 01. In some cases, the sequence of programming pulses may include a plurality of programming pulses, each associated with an energy level. To achieve the intermediate logic state of 01, a first programming pulse from the sequence of programming pulses may be applied. A read operation may be performed to verify whether a current state of the self-selecting memory cell corresponds to the intermediate logic state of 01. In some cases, the read operation may be a non-destructive read operation. In such cases, to verify whether a current state of the self-selecting memory cell is between the intermediate logic state of 10 and the intermediate logic state of 01, the read operation may non-destructively assess that a threshold voltage is higher than the respective logic state. In some cases, the read operation may be selected based at least in part on a desired logic state. If the desired logic state (i.e., 01) is not achieved, then a second programming pulse from the sequence of programming pulses may be applied. The second programming pulse may be configured to have a higher energy level than the first programming pulse. After the application of the second programming pulse, a second read operation may be performed to verify whether the desired logic state is achieved. In some cases, one or more parameters associated with the first read operation may be different than one or more parameters associated with the second read operation. If the desired logic state (i.e., the intermediate logic state of 01) is achieved, then no further programming pulses are applied. In some cases, using a program-verify operation may increase the likelihood of accurate bit placement, but it may reduce other parameters (e.g., latency and/or power consumption).

In some examples, a self-selecting memory cell may be read by applying two or more read voltages to the self-selecting memory cell. In one example, a controller associated with a self-selecting memory cell may apply a first read voltage, and if the first read voltage does not result in a snapback event occurring, a second read voltage may be applied to the self-selecting memory cell as part of the read operation. In some examples, the controller associated with the self-selecting memory cell may apply a third read voltage to the self-selecting memory cell as part of the read operation if the second read voltage does not result in a snapback event. A logic state stored by the self-selecting memory cell may be determined using the first read voltage, the second read voltage, the third read voltage, or any combination thereof.

Figure 4A:
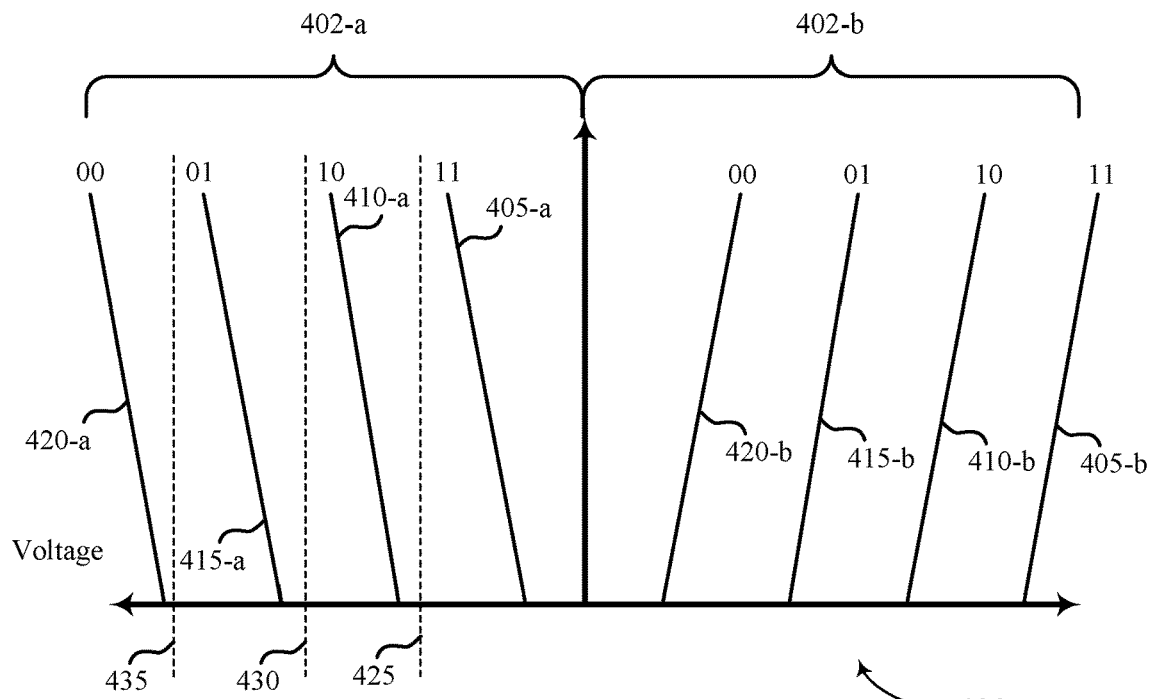
FIG. 4A illustrates an example of a diagram showing distributions of threshold voltages in a self-selecting memory cell that supports reading a multi-level memory cell in accordance with examples as disclosed herein.

FIG. 4A illustrates an example of a diagram 400 showing distributions of threshold voltages in a self-selecting memory cell that supports reading a multi-level memory cell in accordance with examples as disclosed herein. A multi-level self-selecting memory cell may be configured to store a logic state that represents multiple bits of data using a multi-level storage techniques. The voltage distributions depict logic states that may be read.

The threshold voltage distributions may represent a multi-level cell reading scheme for determining a logic stored by the memory cell. In the example of FIG. 4A, the distributions 405 may represent a logic state 11, the distributions 410 may represent a logic state 10, the distributions 415 may represent a logic state 01, and the distribution 420 may represent a logic state 00. The distributions 405-*a*, 410-*a*, 415-*a*, and 420-*a* in portion 402-*a* may correspond to distributions formed using a write pulse having a positive or negative polarity and read using a read pulse having the negative polarity. The distributions 405-*b*, 410-*b*, 415-*b*, and 420-*b* in portion 402-*b* may correspond to distributions formed using a write pulse having the positive or negative polarity and read using a read pulse having the positive polarity. Corresponding distributions (e.g., distributions 405-*a* and 405-*b*, distributions 410-*a* and 410-*b*, distributions 415-*a* and 415-*b*, and distributions 420-*a* and 420-*b*) may be distributions obtained as a result of application of the same write pulse or write pulse sequence for each pair of corresponding distributions. For example, memory cells programmed with a given write pulse may be in either one of the corresponding distributions (e.g., distribution 405-*a* or distribution 405-*b*) based on the polarity of the read pulse.

In some cases, the distributions 405, 410, 415, and 420 may exhibit a median voltage value (such as a normal quantile) corresponding to a voltage distribution for each logic state. In some examples, two distributions may have an overlapping portion, thus may not have clear separation between the two distributions. In some examples, each distribution may not be symmetrical around its median. In some examples, each distribution may exhibit a different ranges of voltage values.

Figure 4B:
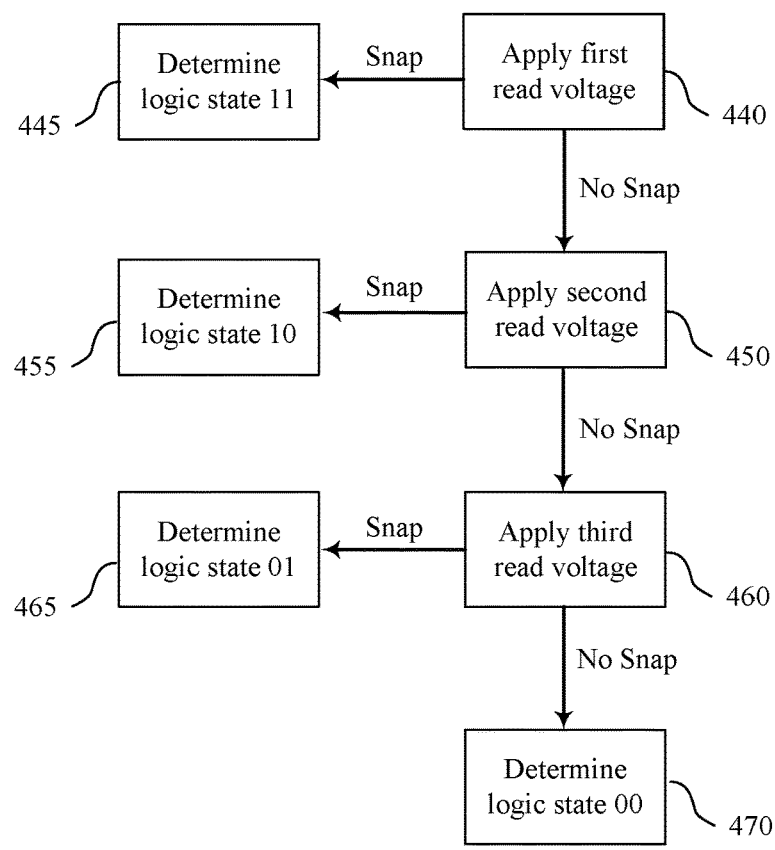
FIG. 4B illustrates an example of a flowchart that supports reading a multi-level memory cell in accordance with examples as disclosed herein.

FIG. 4B illustrates an example of a flowchart 475 that supports reading a multi-level memory cell in accordance with examples as disclosed herein. The operations of flowchart 475 may be implemented by a memory device or its components as described with reference to FIG. 1.

At block 440, the memory device may apply a first read voltage 425. For example, the memory device may apply the first read voltage 425 with a first polarity and a first magnitude to a memory cell to determine a logic state stored by the memory cell. In some cases, the first polarity may be a negative polarity. In some examples, the first read voltage 425 may be an example of a ramping voltage. After applying the first read voltage 425, the memory device may determine whether a first snapback event occurred. The first snapback event may be a snapback event that may or may not occur after applying the first read voltage 425. Whether a snapback event occurs after applying a voltage is a way to detect information stored by a memory cell. In some examples, snapback events occurring after applying read voltages different from the first read voltage 425 (e.g., a second read voltage 430 or third read voltage 435, etc.) may be referred to as second snapback event or a third snapback event, respectively, even if the first snapback event and/or other prior snapback events have not occurred.

At block 445, if the memory device determines that the first snapback event occurred, the memory device may determine the logic state stored by the memory cell. In some cases, the memory device may determine that the first snapback event occurred by determining that the memory cell thresholds after applying the first read voltage 425. For example, the memory device may determine that the logic state is logic state 11 (e.g., represented by distribution 405-*a*). For some logic states stored by a memory cell, the memory device may perform a write-back operation (e.g., a refresh operation or a reprogram operation) after the first snapback event occurs. Some logic states, however, may be reinforced by the first snapback event occurring and a write-back operation may not occur. In some cases, the memory device may identify whether the logic state stored by the memory cell is a first type (e.g., a state that needs a write-back operation) or a second type (e.g., a state that does not need a write-back operation). In other cases, the memory device may be configured to perform a write-back operation (or refrain from performing a write-back operation) based on determining the logic state stored by the memory cell after the first snapback event. In some cases, logic state 11 may correspond to an extreme logic state (e.g., a second type of logic state). In such cases, the memory device may identify that the logic state stored by the memory cell may be the second type that may be reinforced by a snapback event occurring and therefore a write-back operation may not be used. In some examples, the memory device may refrain from performing the write-back operation or refresh operation based on the logic state stored by the memory cell being the second type. In some examples, the memory device may refrain from applying a second read voltage 430 based on identifying the second type of logic state.

The memory device may determine that the first snapback event failed to occur. In such cases, the memory device may determine that the memory cell does not threshold after applying the first read voltage 425. If the memory device determines that the first snapback back event failed to occur, the memory device may apply a second read voltage 430 at block 450. For example, the memory device may apply the second read voltage 430 with the first polarity and a second magnitude to the memory cell. In some cases, the first polarity may be a negative polarity. In such cases, the second read voltage 430 may be the same polarity as the first read voltage 425. The magnitude of the second read voltage 430 may be greater than the magnitude of the first read voltage 425. In some examples, the second read voltage 430 may be an example of a ramping voltage. After applying the second read voltage 430, the memory device may determine whether a second snapback event occurred.

At block 455, if the memory device determines that the second snapback event occurred, the memory device may determine the logic state stored by the memory cell. In some cases, the memory device may determine that the second snapback event occurred by determining that the memory cell thresholds after applying the second read voltage 430. For example, the memory device may determine that the logic state is logic state 10 (e.g., represented by distribution 410-*a*). For some logic states stored by a memory cell, the memory device may perform a write-back operation (e.g., a refresh operation or a reprogram operation) after the second snapback event occurs. Some logic states, however, may be reinforced by the second snapback event occurring and a write-back operation may not occur. In some cases, the memory device may identify whether the logic state stored by the memory cell is a first type (e.g., a state that needs a write-back operation) or a second type (e.g., a state that does not need a write-back operation). In other cases, the memory device may be configured to perform a write-back operation (or refrain from performing a write-back operation) based on determining the logic state stored by the memory cell after the second snapback event. In some cases, logic state 10 may correspond to an intermediate logic state (e.g., a first type of logic state). In such cases, the memory device may identify that the logic state stored by the memory cell may be the first type that may be disturbed after a snapback event occurs (e.g., the memory cell may be reprogrammed using a write-back operation after determining that the snapback event occurs). The memory device may then perform a reprogram operation on the memory cell after determining the logic state 10, determining that the second snapback event occurred, or both. In some examples, the memory device may refrain from applying a second read voltage 430 based on identifying the second type of logic state.

The memory device may determine that the second snapback event failed to occur. In such cases, the memory device may determine that the memory cell does not threshold after applying the second read voltage 430. If the memory device determines that the second snapback back event failed to occur, the memory device may apply a third read voltage 435 at block 460. In such cases, the second snapback event may be a snapback event that may or may not occur after applying the second read voltage 430. Whether a snapback event occurs after applying a voltage is a way to detect information stored by a memory cell. In some examples, snapback events occurring after applying read voltages different from the first read voltage 425 (e.g., a second read voltage 430) may be referred to as a second snapback event even if the first snapback event and/or other prior snapback events have not occurred.

At block 460, the memory device may apply the third read voltage 435 with the first polarity and a third magnitude to the memory cell. In some cases, the first polarity may be a negative polarity. In such cases, the third read voltage 435 may be the same polarity as the first read voltage 425 and the second read voltage 430. The magnitude of the third read voltage 435 may be greater than the magnitude of the second read voltage 430. In such cases, the magnitude of the third read voltage 435 may be greater than the magnitude of the first read voltage 425. In some examples, the third read voltage 435 may be an example of a ramping voltage. After applying the third read voltage 435, the memory device may determine whether a third snapback event occurred. The third snapback event may be a snapback event that may or may not occur after applying the third read voltage 435. Whether a snapback event occurs after applying a voltage is a way to detect information stored by a memory cell. In some examples, snapback events occurring after applying read voltages different from the first read voltage 425 or the second read voltage 430 (e.g., a third read voltage 435) may be referred to as a third snapback event even if the first snapback event, the second snapback event and/or other prior snapback events have not occurred.

At block 465, if the memory device determines that the third snapback event occurred, the memory device may determine the logic state stored by the memory cell. In some cases, the memory device may determine that the third snapback event occurred by determining that the memory cell thresholds after applying the third read voltage 435. For example, the memory device may determine that the logic state is logic state 01 (e.g., represented by distribution 415-a). For some logic states stored by a memory cell, the memory device may perform a write-back operation (e.g., a refresh operation or a reprogram operation) after the third snapback event occurs. Some logic states, however, may be reinforced by the third snapback event occurring and a write-back operation may not occur. In some cases, the memory device may identify whether the logic state stored by the memory cell is a first type (e.g., a state that needs a write-back operation) or a second type (e.g., a state that does not need a write-back operation). In other cases, the memory device may be configured to perform a write-back operation (or refrain from performing a write-back operation) based on determining the logic state stored by the memory cell after the third snapback event. In some cases, logic state 01 may correspond to an intermediate logic state (e.g., the first type of logic state). In such cases, the memory device may identify that the logic state stored by the memory cell may be the first type that may be disturbed after a snapback event occurs (e.g., the memory cell may be reprogrammed after determining that the snapback event occurs). The memory device may then perform a write-back operation (e.g., a reprogram operation) on the memory cell after determining the logic state 01, determining that the third snapback event occurred, or both.

The memory device may determine that the third snapback event failed to occur. In such cases, the memory device may determine that the memory cell does not threshold after applying the third read voltage 435. If the memory device determines that the third snapback event failed to occur, the memory device may determine the logic state at block 470. For example, the memory device may determine that the logic state is logic state 00 (e.g., represented by distribution 420-a). In some cases, logic state 00 may correspond to an extreme logic state (e.g., the second type of logic state). In such cases, the memory device may identify that the logic state stored by the memory cell may be the second type. At block 470, the memory device may refrain from performing a reprogram operation (e.g., refresh operation) on the memory cell after determining that the logic state is 00. In such cases, the memory device may refrain from performing a separate write operation to refresh the memory cell.

In some cases, the flowchart 475 corresponding to the operations of diagram 400 may use an application of three read voltages where the polarity of each read voltage may not be flipped. For example, the polarity of the first read voltage 425, the second read voltage 430, and the third read voltage 435 may be the same polarity (e.g., negative polarity). In such cases, a window budget (e.g., a distance between each distribution 405-a, 410-a, 415-a, and 420-a) may be maintained for a single polarity (e.g., corresponding to portion 402-a). However, a reprogram operation may be performed at block 455 and block 465 (e.g., two total reprogram operations) as well as a higher bias read voltage (e.g., third read voltage 435 as compared to first read voltage 425) may be applied, thereby increasing power consumption.

Figure 5A:
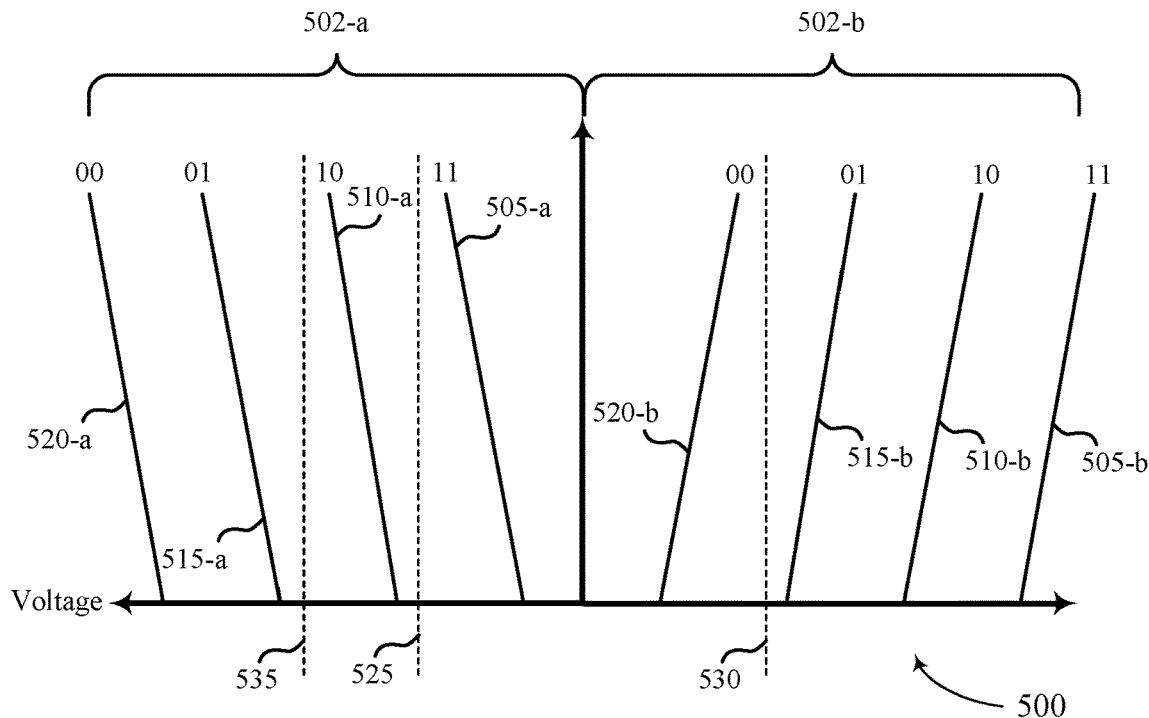
FIG. 5A illustrates an example of a diagram showing distributions of threshold voltages in a self-selecting memory cell that supports reading a multi-level memory cell in accordance with examples as disclosed herein.

FIG. 5A illustrates an example of a diagram 500 showing distributions of threshold voltages in a self-selecting memory cell that supports reading a multi-level memory cell in accordance with examples as disclosed herein. A multi-level self-selecting memory cell may be configured to store a logic state that represents multiple bits of data using a multi-level storage techniques. The voltage distributions depict logic states that may be read.

The threshold voltage distributions may represent a multi-level cell reading scheme for determining a logic stored by the memory cell. In the example of FIG. 5A, the distributions 505 may represent a logic state 11, the distributions 510 may represent a logic state 10, the distributions 515 may represent a logic state 01, and the distribution 520 may represent a logic state 00. The distributions 505-a, 510-a, 515-a, and 520-a in portion 502-a may correspond to distributions formed using a write pulse having a negative or positive polarity and read using a read pulse having the negative polarity. The distributions 505-b, 510-b, 515-b, and 520-b in portion 502-b may correspond to distributions formed using a write pulse having the negative or positive polarity and read using a read pulse having the positive polarity. Corresponding distributions (e.g., distributions 505-a and 505-b, distributions 510-a and 510-b, distributions 515-a and 515-b, and distributions 520-a and 520-b) may be distributions obtained as a result of application of the same write pulse or write pulse sequence for each pair of corresponding distributions. For example, memory cells programmed with a given write pulse may be in either one of the corresponding distributions (e.g., distribution 505-a or distribution 505-b) based on the polarity of the read pulse.

In some cases, the distributions 505, 510, 515, and 520 may exhibit a median voltage value (such as a normal quantile) corresponding to a voltage distribution for each logic state. In some examples, two distributions may have an overlapping portion, thus may not have clear separation between the two distributions. In some examples, each distribution may not be symmetrical around its median. In some examples, each distribution may exhibit a different ranges of voltage values.

Figure 5B:
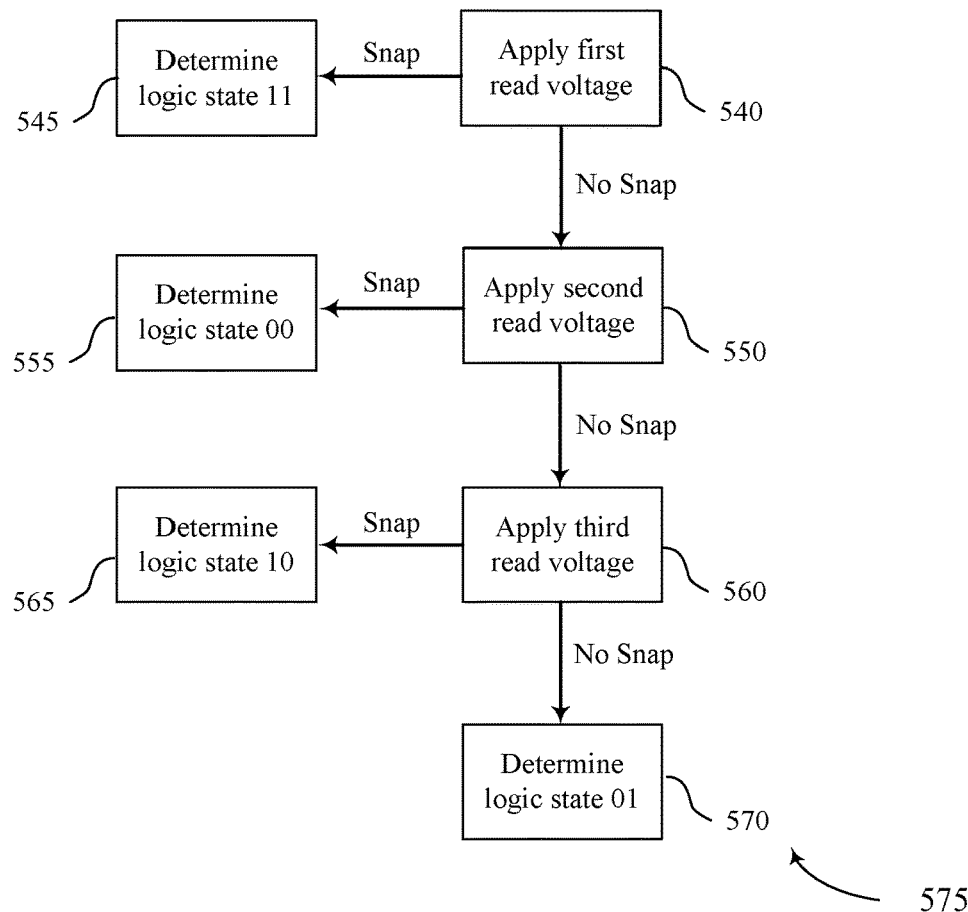
FIG. 5B illustrates an example of a flowchart that supports reading a multi-level memory cell in accordance with examples as disclosed herein.

FIG. 5B illustrates an example of a flowchart 575 that supports reading a multi-level memory cell in accordance with examples as disclosed herein. The operations of flowchart 575 may be implemented by a memory device or its components as described with reference to FIG. 1. The operations of flowchart 575 may be similar to the operations described with reference to the flowchart 475 of FIG. 4. As such, some features described with reference to FIG. 4 may apply to the flowchart 575 of FIG. 5. One difference between the operations of flowchart 575 from the operations of flowchart 475 includes that one of the read voltages (e.g., the second read voltage 530) is a different polarity than the first read voltage 525 or the third read voltage 535. Such a feature may reduce a likelihood that a write-back operation occurs during the read operation associated with the flowchart 575 as compared with a read operation associated with the flowchart 475. Switching the polarities of the read voltages may increase an amount of time or energy for performing the read operation, in some cases.

At block 540, the memory device may apply a first read voltage 525. For example, the memory device may apply the first read voltage 525 with a first polarity to a memory cell to determine a logic state stored by the memory cell. In some cases, the first polarity may be a negative polarity. In some examples, the first read voltage 525 may be an example of a ramping voltage. After applying the first read voltage 525, the memory device may determine whether a first snapback event occurred. The first snapback event may be a snapback event that may or may not occur after applying the first read voltage 525. Whether a snapback event occurs after applying a voltage is a way to detect information stored by a memory cell. In some examples, snapback events occurring after applying read voltages different from the first read voltage 525 (e.g., a second read voltage 530 or third read voltage 535, etc.) may be referred to as second snapback event or a third snapback event, respectively, even if the first snapback event and/or other prior snapback events have not occurred At block 545, if the memory device determines that the first snapback event occurred, the memory device may determine the logic state. In some cases, the memory device may determine that the first snapback event occurred by determining that the memory cell thresholds after applying the first read voltage 525. At block 545, the memory device may determine that the logic state is logic state 11 (e.g., represented by distribution 505-*a*). In some cases, logic state 11 may correspond to an extreme logic state (e.g., a second type of logic state). In such cases, the logic state may be reinforced after a snapback event occurs (e.g., the memory cell may be refreshed after determining that the snapback event occurs). In some examples, the memory device may refrain from performing the write-back operation or refresh operation based on the logic state stored by the memory cell being the second type. In some examples, the memory device may refrain from applying a second read voltage 530 based on identifying the second type of logic state.

The memory device may determine that the first snapback event failed to occur. In such cases, the memory device may determine that the memory cell does not threshold after applying the first read voltage 525. If the memory device determines that the first snapback back event failed to occur, the memory device may apply a second read voltage 530 at block 550. For example, the memory device may apply the second read voltage 530 with a second polarity to the memory cell. In some cases, the second polarity may be a positive polarity. In such cases, the second read voltage 530 may be a different polarity as the first read voltage 525. In some examples, the second read voltage 530 may have a similar magnitude (e.g., in a same range) as the first read voltage 525. The second read voltage 530 may have the same magnitude as the first read voltage 525. In some examples, the second read voltage 530 may be an example of a ramping voltage. After applying the second read voltage 530, the memory device may determine whether a second snapback event occurred.

At block 555, if the memory device determines that the second snapback event occurred, the memory device may determine the logic state. In some cases, the memory device may determine that the second snapback event occurred by determining that the memory cell thresholds after applying the second read voltage 530. At block 555, the memory device may determine that the logic state is logic state 00 (e.g., represented by distribution 520-*b*). In some cases, logic state 00 may correspond to an extreme logic state (e.g., the second type of logic state). In such cases, the memory device may identify that the logic state stored by the memory cell may be the second type. The second type of logic state may be reinforced after a snapback event occurs (e.g., the memory cell may be refreshed after determining that the snapback event occurs). In some examples, the memory device may refrain from performing the write-back operation or refresh operation based on the logic state stored by the memory cell being the second type. In some examples, the memory device may refrain from applying a third read voltage 535 based on identifying the second type of logic state.

The memory device may determine that the second snapback event failed to occur. In such cases, the memory device may determine that the memory cell does not threshold after applying the second read voltage 530. If the memory device determines that the second snapback back event failed to occur, the memory device may apply a third read voltage 535 at block 560. In such cases, the second snapback event may be a snapback event that may or may not occur after applying the second read voltage 530. Whether a snapback event occurs after applying a voltage is a way to detect information stored by a memory cell. In some examples, snapback events occurring after applying read voltages different from the first read voltage 525 (e.g., a second read voltage 530) may be referred to as a second snapback event even if the first snapback event and/or other prior snapback events have not occurred.

At block 560, the memory device may apply the third read voltage 535 with the first polarity to the memory cell. In some cases, the first polarity may be a negative polarity. In such cases, the third read voltage 535 may be the same polarity as the first read voltage 525 and may be a different polarity as the second read voltage 530. A magnitude of the third read voltage 535 may be greater than the magnitude of the second read voltage 530 and the magnitude of the first read voltage 525. In some examples, the third read voltage 535 may be an example of a ramping voltage. After applying the third read voltage 535, the memory device may determine whether a third snapback event occurred. The third snapback event may be a snapback event that may or may not occur after applying the third read voltage 535. Whether a snapback event occurs after applying a voltage is a way to detect information stored by a memory cell. In some examples, snapback events occurring after applying read voltages different from the first read voltage 525 or the second read voltage 530 (e.g., a third read voltage 535) may be referred to as a third snapback event even if the first snapback event, the second snapback event and/or other prior snapback events have not occurred.

At block 565, if the memory device determines that the third snapback event occurred, the memory device may determine the logic state. In some cases, the memory device may determine that the third snapback event occurred by determining that the memory cell thresholds after applying the third read voltage 535. At block 565, the memory device may determine that the logic state is logic state 10 (e.g., represented by distribution 510-*a*). In some cases, logic state 10 may correspond to an intermediate logic state (e.g., a first type of logic state). In such cases, the memory device may identify that the logic state stored by the memory cell may be the first type. The first type of logic state may be disturbed after a snapback event occurs (e.g., the memory cell may be reprogrammed after determining that the snapback event occurs). At block 565, the memory device may perform a write-back operation (e.g., a reprogram operation or a refresh operation) on the memory cell after determining the logic state 10, determining that the third snapback event occurred, or both.

The memory device may determine that the third snapback event failed to occur. In such cases, the memory device may determine that the memory cell does not threshold after applying the third read voltage 535. If the memory device determines that the third snapback event failed to occur, the memory device may determine the logic state at block 570. For example, the memory device may determine that the logic state is logic state 01 (e.g., represented by distribution 515-*a*). In some cases, logic state 01 may correspond to an intermediate logic state (e.g., the first type of logic state). In such cases, the memory device may identify that the logic state stored by the memory cell may be the first type. At block 570, the memory device may refrain from performing a reprogram operation (e.g., refresh operation) on the memory cell after determining that the logic state is 01 because a snapback event did not occur to disturb the logic state of the memory cell.

In some cases, the flowchart 575 corresponding to the operations of diagram 500 may use an application of three read voltages where the polarity of each sequential read voltage may be flipped. In such cases, the memory device may flip the polarity of the read voltages twice. For example, the polarity of the first read voltage 525 may be negative, the polarity of the second read voltage 530 may be positive, and the polarity of the third read voltage 535 may be negative. In such cases, diagram 500 may include a window budget (e.g., a distance between each distribution 505-*a*, 510-*a*, 515-*a*, and 520-*a* or distance between each distribution 505-*b*, 510-*b*, 515-*b*, and 520-*b*) for both polarities (e.g., corresponding to portion 502-*a* and portion 502-*b*). However, a reprogram operation may be performed at block 565 (e.g., one total reprogram operation) as well as a lower bias read voltage (e.g., third read voltage 535 as compared to first read voltage 525) may be applied, thereby decreasing power consumption as compared to the operations of FIG. 4.

Figure 6A:
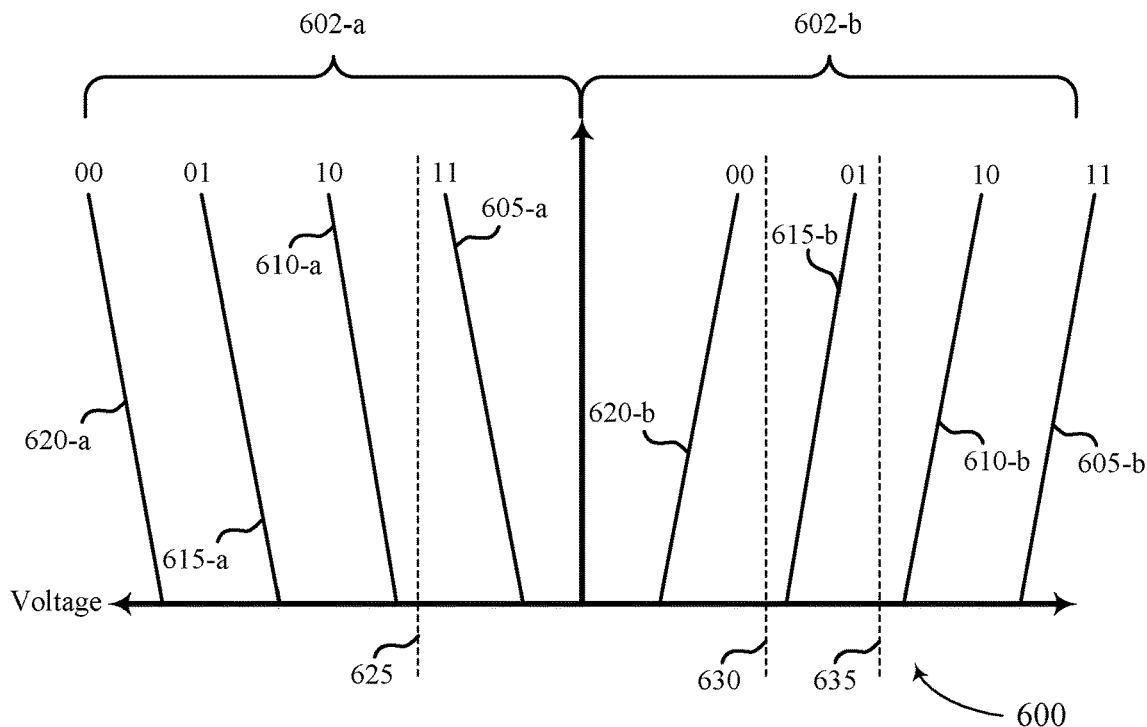
FIG. 6A illustrates an example of a diagram showing distributions of threshold voltages in a self-selecting memory cell that supports reading a multi-level memory cell in accordance with examples as disclosed herein.

FIG. 6A illustrates an example of a diagram 600 showing distributions of threshold voltages in a self-selecting memory cell that supports reading a multi-level memory cell in accordance with examples as disclosed herein. A multi-level self-selecting memory cell may be configured to store a logic state that represents multiple bits of data using a multi-level storage techniques. The voltage distributions depict logic states that may be read. The diagram 600 may be an example of diagram 500 as described with reference to FIG. 5A.

Figure 6B:
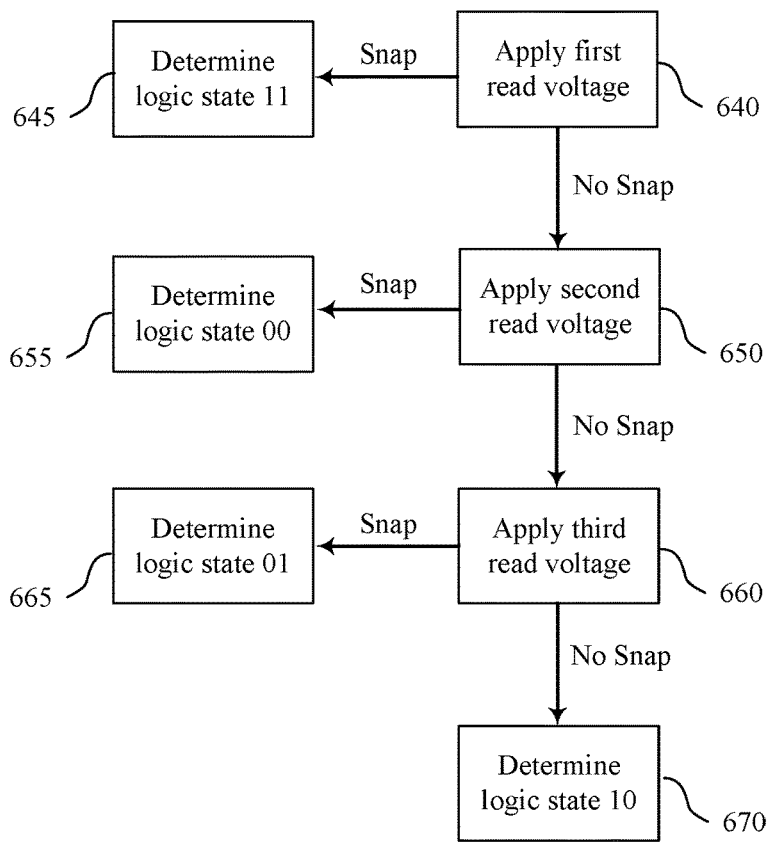
FIG. 6B illustrates an example of a flowchart that supports reading a multi-level memory cell in accordance with examples as disclosed herein.

FIG. 6B illustrates an example of a flowchart 675 that supports reading a multi-level memory cell in accordance with examples as disclosed herein. The operations of flowchart 675 may be implemented by a memory device or its components as described with reference to FIG. 1. The operations of flowchart 675 may be similar to the operations described with reference to the flowcharts 475 and 575 of FIGS. 4 and 5. As such, some features described with reference to FIGS. 4 and 5 may apply to the flowchart 675 of FIG. 6. One difference between the operations of flowchart 675 from the operations of flowchart 575 includes that a quantity of transitions between different polarities of read voltages is reduced from a maximum of two transitions to a maximum of one transition. Such a feature may be accomplished by grouping two read voltages having the same polarity back-to-back in the timing. Such a feature may reduce a duration or an amount of energy for performing the read operation associated with the flowchart 675 as compared with a read operation associated with the flowchart 575. Switching the polarities of the read voltages may increase an amount of time or energy for performing the read operation, in some cases.

The operations performed at blocks 640, 645, 650, and 655 may be examples of operations performed at blocks 540, 545, 550, and 555 as described with reference to FIG. 5B. The first snapback event may be a snapback event that may or may not occur after applying the first read voltage 625. Whether a snapback event occurs after applying a voltage is a way to detect information stored by a memory cell. In some examples, snapback events occurring after applying read voltages different from the first read voltage 625 (e.g., a second read voltage 630 or third read voltage 635, etc.) may be referred to as second snapback event or a third snapback event, respectively, even if the first snapback event and/or other prior snapback events have not occurred.

At block 660, if the memory device determines that the second snapback back event failed to occur, the memory device may apply a third read voltage 635. In such cases, the second snapback event may be a snapback event that may or may not occur after applying the second read voltage 630. In some examples, snapback events occurring after applying read voltages different from the first read voltage 625 (e.g., a second read voltage 630) may be referred to as a second snapback event even if the first snapback event and/or other prior snapback events have not occurred.

At block 660, the memory device may apply the third read voltage 635 with the second polarity to the memory cell. In some cases, the second polarity may be the positive polarity. In such cases, the third read voltage 635 may be the same polarity as the second read voltage 630 and may be a different polarity as the first read voltage 625. A magnitude of the third read voltage 635 may be greater than the magnitude of the second read voltage 630 and the magnitude of the first read voltage 625. In some examples, the third read voltage 635 may be an example of a ramping voltage. After applying the third read voltage 635, the memory device may determine whether a third snapback event occurred. The third snapback event may be a snapback event that may or may not occur after applying the third read voltage 635.

In some examples, snapback events occurring after applying read voltages different from the first read voltage 625 or the second read voltage 630 (e.g., a third read voltage 635) may be referred to as a third snapback event even if the first snapback event, the second snapback event and/or other prior snapback events have not occurred.

If the memory device determines that the third snapback event occurred, the memory device may determine the logic state at block 665. In some cases, the memory device may determine that the third snapback event occurred by determining that the memory cell thresholds after applying the third read voltage 635. At block 665, the memory device may determine that the logic state is logic state 01 (e.g., represented by distribution 615-*b*). In some cases, logic state 01 may correspond to an intermediate logic state (e.g., a first type of logic state). In such cases, the memory device may identify that the logic state stored by the memory cell may be the first type. The first type of logic state may be disturbed after a snapback event occurs (e.g., the memory cell may be reprogrammed after determining that the snapback event occurs). At block 665, the memory device may perform then a reprogram operation on the memory cell after determining that the logic state is 01, determining that the third snapback event occurred, or both.

The memory device may determine that the third snapback event failed to occur. In such cases, the memory device may determine that the memory cell does not threshold after applying the third read voltage 635. If the memory device determines that the third snapback event failed to occur, the memory device may determine the logic state at block 670. For example, the memory device may determine that the logic state is logic state 10 (e.g., represented by distribution 610-*b*). In some cases, logic state 10 may correspond to an intermediate logic state (e.g., the first type of logic state). In such cases, the memory device may identify that the logic state stored by the memory cell may be the first type. At block 670, the memory device may refrain from performing a reprogram operation (e.g., refresh operation) on the memory cell after determining that the logic state is 10, determining that the third snapback event failed to occur, or both. In such cases, the memory device may refrain from performing a separate write operation to refresh the memory cell.

In some cases, the flowchart 675 corresponding to the operations of diagram 600 may use an application of three read voltages where the polarity of the first two sequential read voltages may be flipped. In such cases, the memory device may flip the polarity of the read voltages once. For example, the polarity of the first read voltage 625 may be negative, the polarity of the second read voltage 630 may be positive, and the polarity of the third read voltage 635 may be positive. In such cases, diagram 600 may include a window budget (e.g., a distance between each distribution 605-*a*, 610-*a*, 615-*a*, and 620-*a* or distance between each distribution 605-*b*, 610-*b*, 615-*b*, and 620-*b*) for both polarities (e.g., corresponding to portion 602-*a* and portion 602-*b*). However, a reprogram operation may be performed at block 665 (e.g., one total reprogram operation) as well as a lower bias read voltage (e.g., third read voltage 635 as compare to first read voltage 625) may be applied, thereby decreasing power consumption as compared to the operations of FIG. 4. In some examples, a read scheme according to diagram 600 may decrease the power consumption and increase the performance of the memory device as compared to the operations of FIG. 5.

Figure 7:
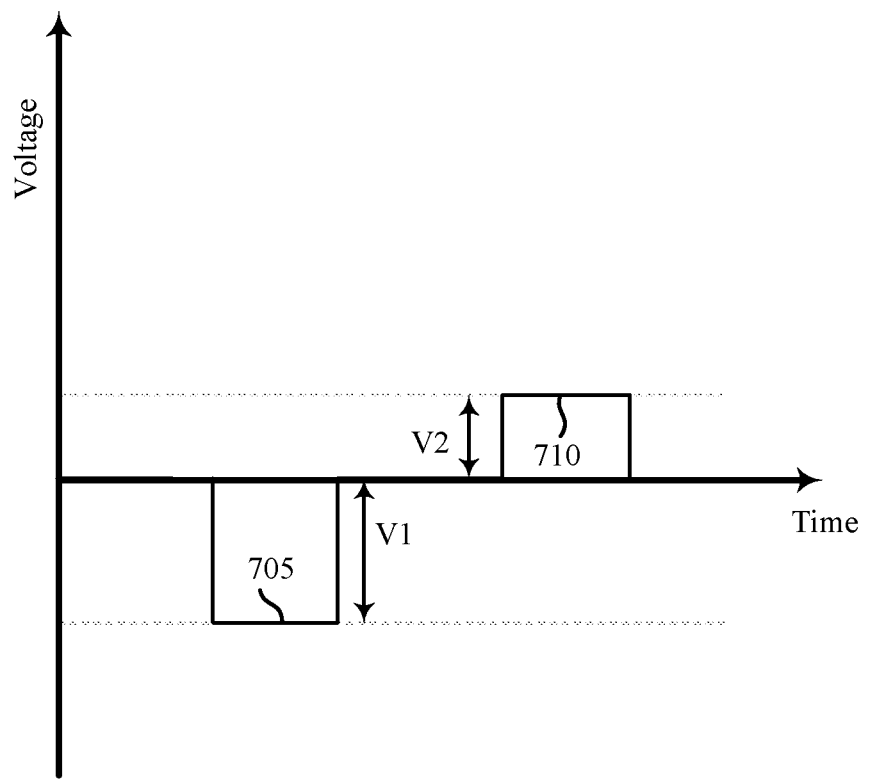
FIG. 7 illustrates an example of a timing diagram that supports reading a multi-level memory cell in accordance with examples as disclosed herein.

FIG. 7 illustrates an example of a timing diagram 700 that supports reading a multi-level memory cell in accordance with examples as disclosed herein. The timing diagram 700 may include a read pulse 705 and a reprogram pulse 710. The timing diagram 700 may plot a magnitude of the voltage of one or more pulses (y-axis) applied to the memory cell with respect to time (x-axis). The reprogram pulse 710 may be an opposite polarity as the read pulse 705 and may have a lower magnitude than the read pulse 705. In some examples, the reprogram pulse 710 may be an opposite polarity as the read pulse 705 and may have a higher magnitude than the read pulse 705. In some cases, the read pulse 705 may include a voltage distribution stored by the memory cell to one of the extreme states (e.g., distribution 305 or distribution 320 as described with reference to FIG. 3A). In such cases, the reprogram pulse 710 may be a reduced energy magnitude because the amount of change desired in the voltage distribution of the memory cell is less. Such cases may be similar in principle to the write operation described with reference to FIGS. 3A and 3B. Having a reprogram pulse 710 of a reduced magnitude may conserve power relative to other possible solutions.

In some cases, a memory cell may be programmed with an intermediate logic state (e.g., logic state 01 or logic state 10). In such cases, two pulses of opposite polarity may be applied to the memory cell. For example, the memory device may apply a first pulse (e.g., read pulse 705). The read pulse 705 may include a negative polarity. In such cases, the read pulse 705 may be a square pulse having the negative polarity with a fixed magnitude corresponding to V1. In some cases, the read pulse 705 may be an example of the third read voltage 435 and third read voltage 535 as described in reference to FIGS. 4B and 5B. For example, the read pulse 705 may be applied based on determining that the second snapback event failed to occur. In some examples, the read pulse 705 may be an example of the second read voltage 430 as described in reference to FIG. 4B. In such cases, the read pulse 705 may be applied after determining that the first snapback event failed to occur.

After applying the read pulse 705, the memory device may apply a second pulse (e.g., reprogram pulse 710). The reprogram pulse 710 may include a polarity opposite the polarity of the read pulse 705. For example, the reprogram pulse 710 may include a positive polarity while the read pulse 705 may include the negative polarity. The reprogram pulse 710 may be a square pulse having the positive polarity with a fixed magnitude corresponding to V2. The magnitude of the reprogram pulse 710 may be less than the magnitude of the read pulse 705. In some examples, the magnitude of the reprogram pulse 710 may be greater than the magnitude of the read pulse 705. In some cases, the reprogram pulse 710 may be an example of the reprogram operation performed at blocks 455, 465 and 565 as described in reference to FIGS. 4B and 5B. For example, the reprogram pulse 710 may be applied based on determining that the logic state is an intermediate state (e.g., logic state 01 or logic state 10).

In some cases, the read pulse 705 may include a positive polarity. In such cases, the read pulse 705 may be an example of the third read voltage 635 as described in reference to FIG. 6B. For example, the read pulse 705 may be applied based on determining that the second snapback event failed to occur. After applying the read pulse 705 with the positive polarity, the memory device may apply a second pulse (e.g., reprogram pulse 710) with a negative polarity. In some cases, the reprogram pulse 710 may be an example of the reprogram operation performed at block 665 as described in reference to FIG. 6B. For example, the reprogram pulse 710 may be applied based on determining that the logic state is an intermediate state (e.g., logic state 01). The reprogram pulse 710 with a negative polarity may include a magnitude less than a magnitude of the read pulse 705 with a positive polarity. In some examples, the reprogram pulse 710 with a negative polarity may include a magnitude greater than a magnitude of the read pulse 705 with a positive polarity.

The memory device may perform the reprogram operation (e.g., apply the reprogram pulse 710) after performing the read operation (e.g., applying the read pulse 705). In some cases, the first pulse (e.g., read pulse 705) may serve as a first step in the reprogramming operation, thereby resulting in an additional time and power consumption as compared to performing a reprogram operation with a single pulse. In such cases, the first pulse may not be a part of the reprogram operation such that the first pulse is the read pulse 705 while the second pulse may be the reprogram pulse 710. In some cases, the reprogramming operation may be part of the read operation as an embedded command or a separate command dedicated to the reprogram operation.

Figure 8:
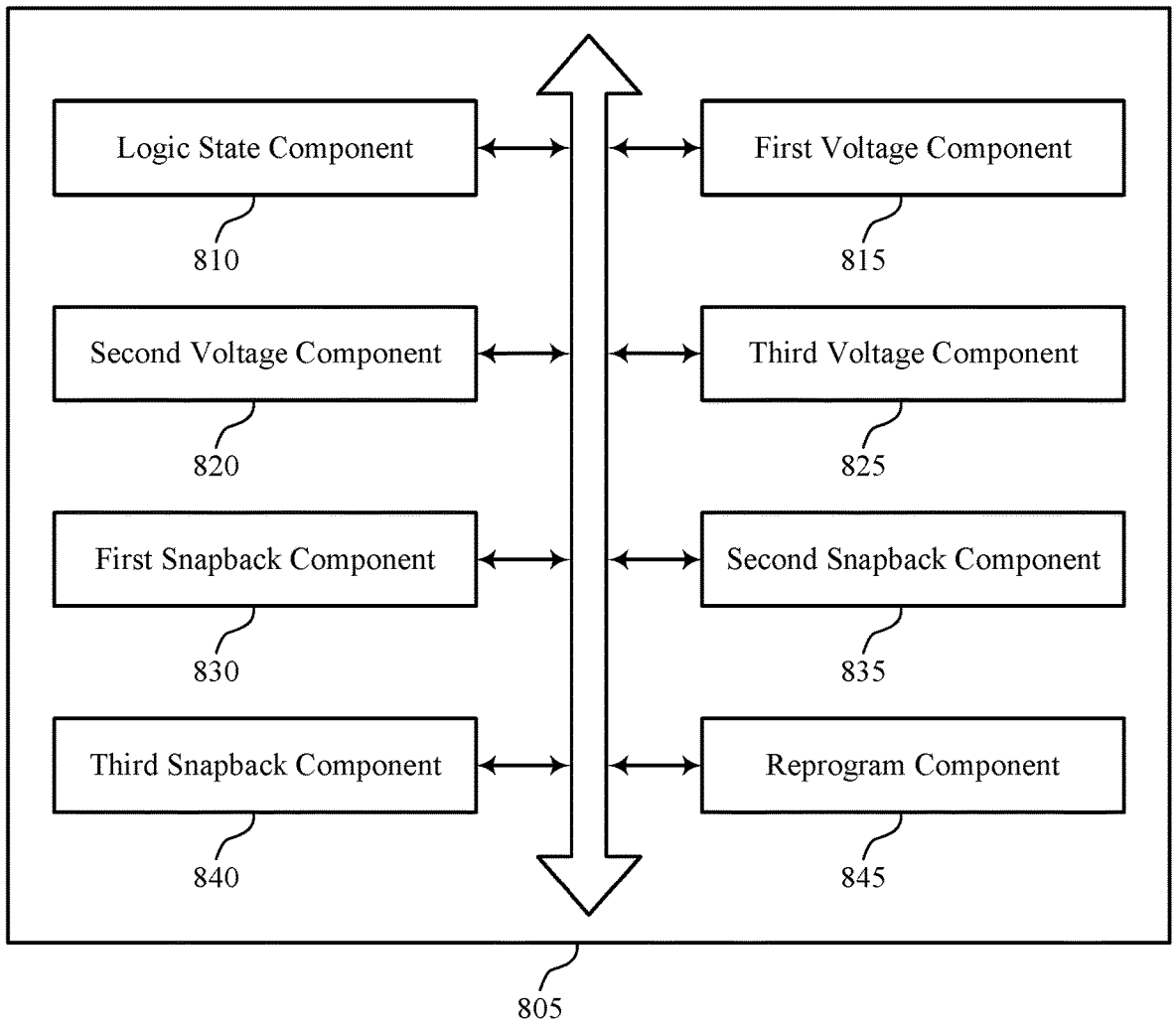
FIG. 8 shows a block diagram of a memory device that supports reading a multi-level memory cell in accordance with examples as disclosed herein.

FIG. 8 shows a block diagram 800 of a memory device 805 that supports reading a multi-level memory cell in accordance with examples as disclosed herein. The memory device 805 may be an example of aspects of a memory device as described with reference to FIGS. 1 through 7. The memory device 805 may include a logic state component 810, a first voltage component 815, a second voltage component 820, a third voltage component 825, a first snapback component 830, a second snapback component 835, a third snapback component 840, and a reprogram component 845. Each of these modules may communicate, directly or indirectly, with one another (e.g., via one or more buses).

The logic state component 810 may determine the logic state stored by the memory cell based on determining whether the first snapback event or the second snapback event occurred. In some examples, the logic state component 810 may determine the logic state stored by the memory cell based on determining whether the first snapback event, the second snapback event, or the third snapback event occurred.

In some examples, the logic state component 810 may identify that the logic state stored by the memory cell includes a first type based on determining that the third snapback event occurred, where performing the reprogram operation is based on identifying that the logic state stored by the memory cell includes the first type. In some examples, the logic state component 810 may identify that the logic state stored by the memory cell includes a first type that is disturbed after a snapback event occurs.

In some examples, the logic state component 810 may identify that the logic state stored by the memory cell includes a first type that is disturbed after a snapback event occurs based on determining that the second snapback event occurred, where performing the reprogram operation on the memory cell is based on identifying that the logic state includes the first type. In some examples, the logic state component 810 may identify that the logic state stored by the memory cell includes a second type that is reinforced after a snapback event occurs based on determining that the first snapback event occurred.

The first voltage component 815 may apply a first read voltage with a first polarity to a memory cell to determine a logic state stored by the memory cell configured to store three or more logic states. In some examples, the first voltage component 815 may apply a first read voltage with a first polarity and a first magnitude to a memory cell to determine a logic state stored by the memory cell configured to store three or more logic states.

In some cases, the first polarity includes a negative polarity and the second polarity includes a positive polarity. In some cases, a magnitude of the first read voltage is similar to a magnitude of the second read voltage. In some cases, the first polarity includes a negative polarity. In some cases, the second magnitude is greater than the first magnitude, wherein the third magnitude is greater than the second magnitude.

The second voltage component 820 may apply a second read voltage with a second polarity to the memory cell based on determining that the first snapback event failed to occur. In some examples, the second voltage component 820 may apply a second read voltage with the first polarity and a second magnitude to the memory cell based on determining that the first snapback event failed to occur.

The third voltage component 825 may apply a third read voltage with the first polarity and a third magnitude to the memory cell based on determining that the second snapback event failed to occur. In some examples, the third voltage component 825 may apply a third read voltage with the first polarity and a magnitude greater than a magnitude of the second read voltage to the memory cell based on determining that the second snapback event failed to occur. In some examples, the third voltage component 825 may apply a third read voltage with the second polarity and a magnitude greater than a magnitude of the second read voltage to the memory cell based on determining that the second snapback event failed to occur. In some examples, the third voltage component 825 may determine that the third snapback event failed to occur.

The first snapback component 830 may determine whether a first snapback event occurred after applying the first read voltage. In some examples, the first snapback component 830 may determine that the memory cell thresholds after applying the first read voltage. In some examples, the first snapback component 830 may determine that the first snapback event occurred based on determining that the memory cell thresholds after applying the first read voltage.

The second snapback component 835 may determine whether a second snapback event occurred after applying the second read voltage. In some examples, the second snapback component 835 may determine that the second snapback event occurred.

The third snapback component 840 may determine whether a third snapback event occurred after applying the third read voltage. In some examples, the third snapback component 840 may determine whether a third snapback event occurred after applying the third read voltage, where determining the logic state stored by the memory cell is based on determining whether the third snapback event occurred.

In some examples, the third snapback component 840 may determine that the third snapback event occurred. In some examples, the third snapback component 840 may determine that the third snapback event failed to occur. In some examples, the third snapback component 840 may determine whether a third snapback event occurred after applying the third read voltage, where determining the logic state stored by the memory cell is based on determining whether the third snapback event occurred.

The reprogram component 845 may perform a reprogram operation on the memory cell after determining the logic state stored by the memory cell based on determining that the third snapback event occurred. In some examples, the reprogram component 845 may refrain from performing a reprogram operation on the memory cell based on determining that the third snapback event failed to occur. In some examples, the reprogram component 845 may perform a reprogram operation on the memory cell based on identifying that the logic state includes the first type. In some examples, the reprogram component 845 may perform a reprogram operation on the memory cell based on determining that the second snapback event occurred, where determining the logic state stored by the memory cell is based on determining that the second snapback event occurred.

Figure 9:
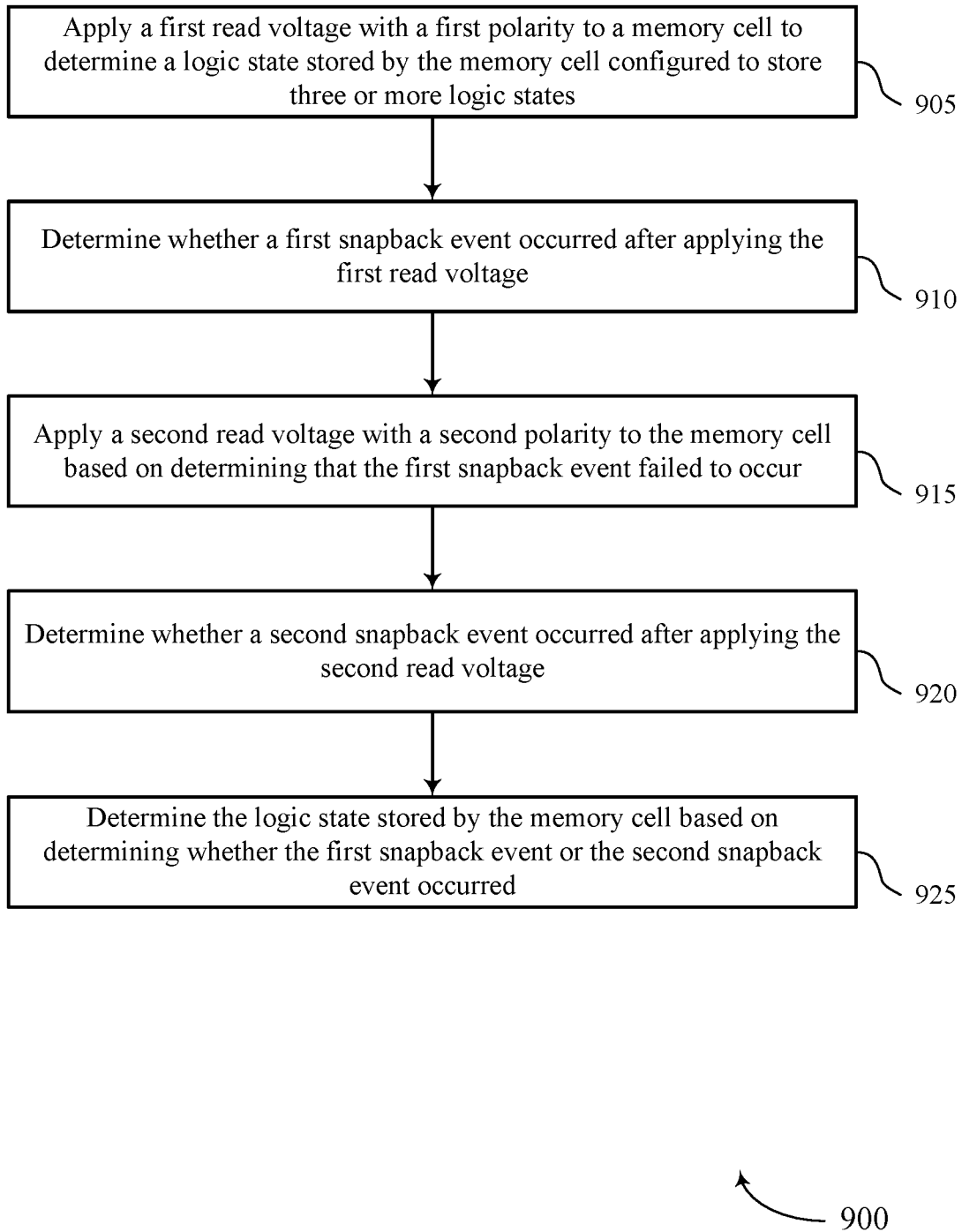
FIGS. 9 and 10 show flowcharts illustrating a method or methods that support reading a multi-level memory cell in accordance with examples as disclosed herein.

FIG. 9 shows a flowchart illustrating a method or methods 900 that supports reading a multi-level memory cell in accordance with examples as disclosed herein. The operations of method 900 may be implemented by a memory device or its components as described herein. For example, the operations of method 900 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 905, the memory device may apply a first read voltage with a first polarity to a memory cell to determine a logic state stored by the memory cell configured to store three or more logic states. The operations of 905 may be performed according to the methods described herein. In some examples, aspects of the operations of 905 may be performed by a first voltage component as described with reference to FIG. 8.

At 910, the memory device may determine whether a first snapback event occurred after applying the first read voltage. The operations of 910 may be performed according to the methods described herein. In some examples, aspects of the operations of 910 may be performed by a first snapback component as described with reference to FIG. 8.

At 915, the memory device may apply a second read voltage with a second polarity to the memory cell based on determining that the first snapback event failed to occur. The operations of 915 may be performed according to the methods described herein. In some examples, aspects of the operations of 915 may be performed by a second voltage component as described with reference to FIG. 8.

At 920, the memory device may determine whether a second snapback event occurred after applying the second read voltage. The operations of 920 may be performed according to the methods described herein. In some examples, aspects of the operations of 920 may be performed by a second snapback component as described with reference to FIG. 8.

At 925, the memory device may determine the logic state stored by the memory cell based on determining whether the first snapback event or the second snapback event occurred. The operations of 925 may be performed according to the methods described herein. In some examples, aspects of the operations of 925 may be performed by a logic state component as described with reference to FIG. 8.

The first snapback event may be a snapback event that may or may not occur after applying the first read voltage. Whether a snapback event occurs after applying a voltage is a way to detect information stored by a memory cell. In some examples, snapback events occurring after applying read voltages different from the first read voltage (e.g., a second read voltage or third read voltage, etc.) may be referred to as second snapback event or a third snapback event, respectively, even if the first snapback event and/or other prior snapback events have not occurred.

In some examples, an apparatus as described herein may perform a method or methods, such as the method 900. The apparatus may include features, means, or instructions (e.g., a non-transitory computer-readable medium storing instructions executable by a processor) for applying a first read voltage with a first polarity to a memory cell to determine a logic state stored by the memory cell configured to store three or more logic states, determining whether a first snapback event occurred after applying the first read voltage, applying a second read voltage with a second polarity to the memory cell based on determining that the first snapback event failed to occur, determining whether a second snapback event occurred after applying the second read voltage, and determining the logic state stored by the memory cell based on determining whether the first snapback event or the second snapback event occurred.

Some examples of the method 900 and the apparatus described herein may further include operations, features, means, or instructions for applying a third read voltage with the first polarity and a magnitude greater than a magnitude of the second read voltage to the memory cell based on determining that the second snapback event failed to occur, and determining whether a third snapback event occurred after applying the third read voltage, where determining the logic state stored by the memory cell may be based on determining whether the third snapback event occurred.

Some examples of the method 900 and the apparatus described herein may further include operations, features, means, or instructions for determining that the third snapback event occurred, and performing a reprogram operation on the memory cell after determining the logic state stored by the memory cell based on determining that the third snapback event occurred.

Some examples of the method 900 and the apparatus described herein may further include operations, features, means, or instructions for identifying that the logic state stored by the memory cell includes a first type based on determining that the third snapback event occurred, where performing the reprogram operation may be based on identifying that the logic state stored by the memory cell includes the first type.

Some examples of the method 900 and the apparatus described herein may further include operations, features, means, or instructions for determining that the third snapback event failed to occur, and refraining from performing a reprogram operation on the memory cell based on determining that the third snapback event failed to occur.

Some examples of the method 900 and the apparatus described herein may further include operations, features, means, or instructions for applying a third read voltage with the second polarity and a magnitude greater than a magnitude of the second read voltage to the memory cell based on determining that the second snapback event failed to occur, and determining whether a third snapback event occurred after applying the third read voltage, where determining the logic state stored by the memory cell may be based on determining whether the third snapback event occurred.

Some examples of the method 900 and the apparatus described herein may further include operations, features, means, or instructions for determining that the third snapback event occurred, and performing a reprogram operation on the memory cell after determining the logic state stored by the memory cell based on determining that the third snapback event occurred.

Some examples of the method 900 and the apparatus described herein may further include operations, features, means, or instructions for identifying that the logic state stored by the memory cell includes a first type based on determining that the third snapback event occurred, where performing the reprogram operation may be based on identifying that the logic state stored by the memory cell includes the first type.

Some examples of the method 900 and the apparatus described herein may further include operations, features, means, or instructions for determining that the third snapback event failed to occur, and refraining from performing a reprogram operation on the memory cell based on determining that the third snapback event failed to occur.

Some examples of the method 900 and the apparatus described herein may further include operations, features, means, or instructions for identifying that the logic state stored by the memory cell includes a first type that may be disturbed after a snapback event occurs, and performing a reprogram operation on the memory cell based on identifying that the logic state includes the first type.

Some examples of the method 900 and the apparatus described herein may further include operations, features, means, or instructions for identifying that the logic state stored by the memory cell includes a second type that may be reinforced after a snapback event occurs based on determining that the first snapback event occurred.

Some examples of the method 900 and the apparatus described herein may further include operations, features, means, or instructions for determining that the memory cell thresholds after applying the first read voltage, and determining that the first snapback event occurred based on determining that the memory cell thresholds after applying the first read voltage.

In some examples of the method 900 and the apparatus described herein, the first polarity includes a negative polarity and the second polarity includes a positive polarity.

In some examples of the method 900 and the apparatus described herein, a magnitude of the first read voltage may be similar to a magnitude of the second read voltage.

Figure 10:
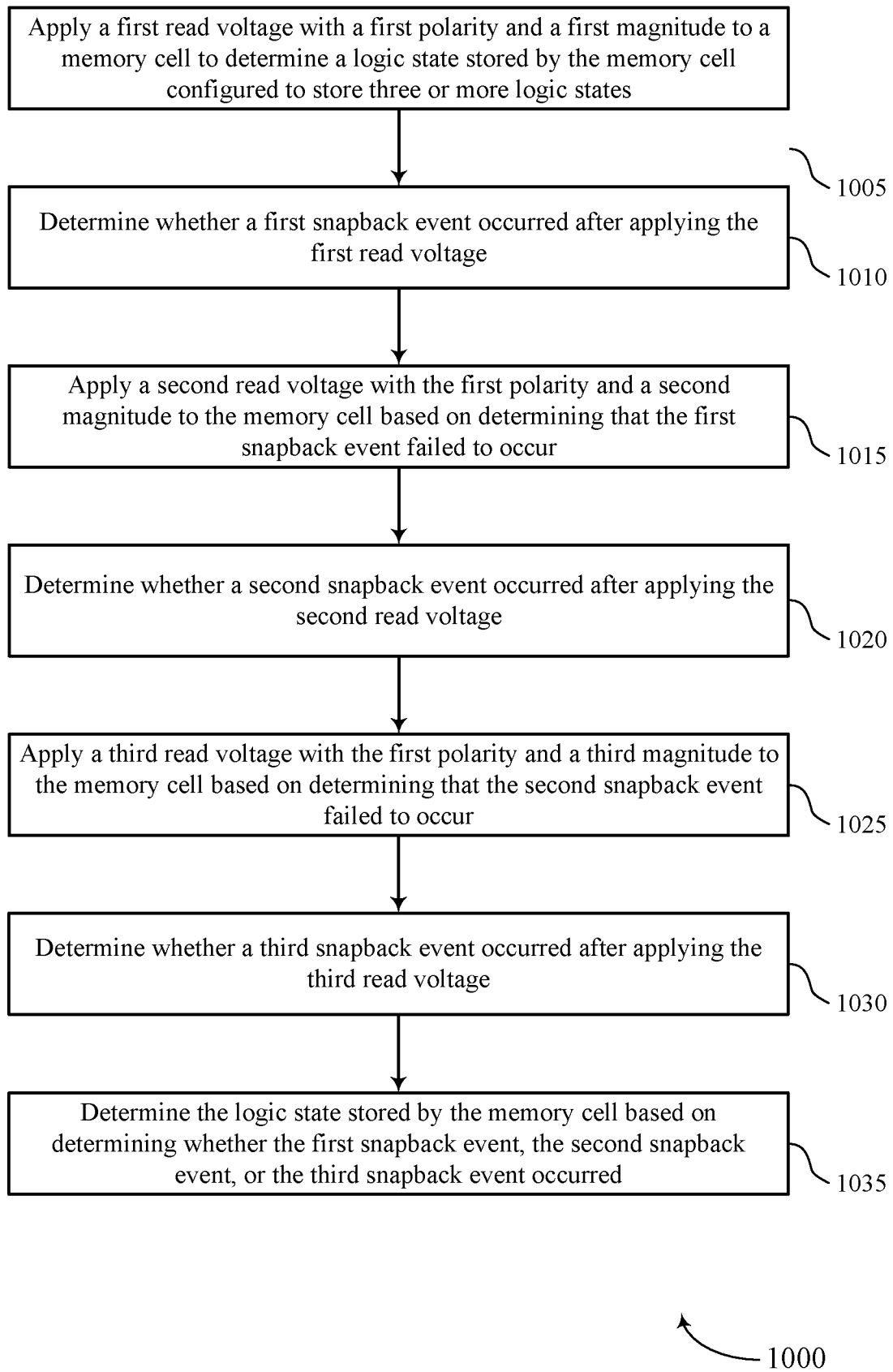

FIG. 10 shows a flowchart illustrating a method or methods 1000 that supports reading a multi-level memory cell in accordance with examples as disclosed herein. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may apply a first read voltage with a first polarity and a first magnitude to a memory cell to determine a logic state stored by the memory cell configured to store three or more logic states. The operations of 1005 may be performed according to the methods described herein. In some examples, aspects of the operations of 1005 may be performed by a first voltage component as described with reference to FIG. 8.

At 1010, the memory device may determine whether a first snapback event occurred after applying the first read voltage. The operations of 1010 may be performed according to the methods described herein. In some examples, aspects of the operations of 1010 may be performed by a first snapback component as described with reference to FIG. 8.

At 1015, the memory device may apply a second read voltage with the first polarity and a second magnitude to the memory cell based on determining that the first snapback event failed to occur. The operations of 1015 may be performed according to the methods described herein. In some examples, aspects of the operations of 1015 may be performed by a second voltage component as described with reference to FIG. 8.

At 1020, the memory device may determine whether a second snapback event occurred after applying the second read voltage. The operations of 1020 may be performed according to the methods described herein. In some examples, aspects of the operations of 1020 may be performed by a second snapback component as described with reference to FIG. 8.

At 1025, the memory device may apply a third read voltage with the first polarity and a third magnitude to the memory cell based on determining that the second snapback event failed to occur. The operations of 1025 may be performed according to the methods described herein. In some examples, aspects of the operations of 1025 may be performed by a third voltage component as described with reference to FIG. 8.

At 1030, the memory device may determine whether a third snapback event occurred after applying the third read voltage. The operations of 1030 may be performed according to the methods described herein. In some examples, aspects of the operations of 1030 may be performed by a third snapback component as described with reference to FIG. 8.

At 1035, the memory device may determine the logic state stored by the memory cell based on determining whether the first snapback event, the second snapback event, or the third snapback event occurred. The operations of 1035 may be performed according to the methods described herein. In some examples, aspects of the operations of 1035 may be performed by a logic state component as described with reference to FIG. 8.

The first snapback event may be a snapback event that may or may not occur after applying the first read voltage. Whether a snapback event occurs after applying a voltage is a way to detect information stored by a memory cell. In some examples, snapback events occurring after applying read voltages different from the first read voltage (e.g., a second read voltage or third read voltage, etc.) may be referred to as second snapback event or a third snapback event, respectively, even if the first snapback event and/or other prior snapback events have not occurred.

In some examples, an apparatus as described herein may perform a method or methods, such as the method 1000. The apparatus may include features, means, or instructions (e.g., a non-transitory computer-readable medium storing instructions executable by a processor) for applying a first read voltage with a first polarity and a first magnitude to a memory cell to determine a logic state stored by the memory cell configured to store three or more logic states, determining whether a first snapback event occurred after applying the first read voltage, applying a second read voltage with the first polarity and a second magnitude to the memory cell based on determining that the first snapback event failed to occur, determining whether a second snapback event occurred after applying the second read voltage, applying a third read voltage with the first polarity and a third magnitude to the memory cell based on determining that the second snapback event failed to occur, determining whether a third snapback event occurred after applying the third read voltage, and determining the logic state stored by the memory cell based on determining whether the first snapback event, the second snapback event, or the third snapback event occurred.

Some examples of the method 1000 and the apparatus described herein may further include operations, features, means, or instructions for determining that the third snapback event occurred, and performing a reprogram operation on the memory cell after determining the logic state stored by the memory cell based on determining that the third snapback event occurred.

Some examples of the method 1000 and the apparatus described herein may further include operations, features, means, or instructions for identifying that the logic state stored by the memory cell includes a first type based on determining that the third snapback event occurred, where performing the reprogram operation may be based on identifying that the logic state stored by the memory cell includes the first type.

Some examples of the method 1000 and the apparatus described herein may further include operations, features, means, or instructions for determining that the third snapback event failed to occur, and refraining from performing a reprogram operation on the memory cell based on determining that the third snapback event failed to occur.

Some examples of the method 1000 and the apparatus described herein may further include operations, features, means, or instructions for determining that the second snapback event occurred, and performing a reprogram operation on the memory cell based on determining that the second snapback event occurred, where determining the logic state stored by the memory cell may be based on determining that the second snapback event occurred.

Some examples of the method 1000 and the apparatus described herein may further include operations, features, means, or instructions for identifying that the logic state stored by the memory cell includes a first type that may be disturbed after a snapback event occurs based on determining that the second snapback event occurred, where performing the reprogram operation on the memory cell may be based on identifying that the logic state includes the first type.

Some examples of the method 1000 and the apparatus described herein may further include operations, features, means, or instructions for identifying that the logic state stored by the memory cell includes a second type that may be reinforced after a snapback event occurs based on determining that the first snapback event occurred.

Some examples of the method 1000 and the apparatus described herein may further include operations, features, means, or instructions for determining that the memory cell thresholds after applying the first read voltage, and determining that the first snapback event occurred based on determining that the memory cell thresholds after applying the first read voltage.

In some examples of the method 1000 and the apparatus described herein, the first polarity includes a negative polarity.

In some examples of the method 1000 and the apparatus described herein, the second magnitude may be greater than the first magnitude, where the third magnitude may be greater than the second magnitude.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array comprising a memory cell and a control component coupled with the memory array, the control component configured to cause the apparatus to apply a first read voltage with a first polarity to a memory cell to determine a logic state stored by the memory cell configured to store three or more logic states, determine whether a first snapback event occurred after applying the first read voltage, apply a second read voltage with a second polarity to the memory cell based on determining that the first snapback event failed to occur, determine whether a second snapback event occurred after applying the second read voltage, and determine the logic state stored by the memory cell based on determining whether the first snapback event or the second snapback event occurred.

Some examples may further include applying a third read voltage with the first polarity and a magnitude greater than a magnitude of the second read voltage to the memory cell based on determining that the second snapback event failed to occur, and determining whether a third snapback event occurred after applying the third read voltage, where determining the logic state stored by the memory cell may be based on determining whether the third snapback event occurred.

Some examples may further include determining that the third snapback event occurred, and performing a reprogram operation on the memory cell after determining the logic state stored by the memory cell based on determining that the third snapback event occurred.

Some examples may further include identifying that the logic state stored by the memory cell includes a first type based on determining that the third snapback event occurred, where performing the reprogram operation may be based on identifying that the logic state stored by the memory cell includes the first type.

Some examples may further include determining that the third snapback event failed to occur, and refraining from performing a reprogram operation on the memory cell based on determining that the third snapback event failed to occur.

Some examples may further include applying a third read voltage with the second polarity and a magnitude greater than a magnitude of the second read voltage to the memory cell based on determining that the second snapback event failed to occur, and determining whether a third snapback event occurred after applying the third read voltage, where determining the logic state stored by the memory cell may be based on determining whether the third snapback event occurred.

Some examples may further include determining that the third snapback event occurred, and performing a reprogram operation on the memory cell after determining the logic state stored by the memory cell based on determining that the third snapback event occurred.

Some examples may further include identifying that the logic state stored by the memory cell includes a first type based on determining that the third snapback event occurred, where performing the reprogram operation may be based on identifying that the logic state stored by the memory cell includes the first type.

Some examples may further include determining that the third snapback event failed to occur, and refraining from performing a reprogram operation on the memory cell based on determining that the third snapback event failed to occur.

Some examples may further include identifying that the logic state stored by the memory cell includes a first type that may be disturbed after a snapback event occurs, and performing a reprogram operation on the memory cell based on identifying that the logic state includes the first type.

Some examples may further include identifying that the logic state stored by the memory cell includes a second type that may be reinforced after a snapback event occurs based on determining that the first snapback event occurred.

Some examples may further include determining that the memory cell thresholds after applying the first read voltage, and determining that the first snapback event occurred based on determining that the memory cell thresholds after applying the first read voltage.

In some examples, the first polarity includes a negative polarity and the second polarity includes a positive polarity.

In some examples, a magnitude of the first read voltage may be similar to a magnitude of the second read voltage.

An apparatus is described. The apparatus may include a memory array comprising a memory cell and a control component coupled with the memory array, the control component configured to cause the apparatus to apply a first read voltage with a first polarity and a first magnitude to a memory cell to determine a logic state stored by the memory cell configured to store three or more logic states, determine whether a first snapback event occurred after applying the first read voltage, apply a second read voltage with the first polarity and a second magnitude to the memory cell based on determining that the first snapback event failed to occur, determine whether a second snapback event occurred after applying the second read voltage, apply a third read voltage with the first polarity and a third magnitude to the memory cell based on determining that the second snapback event failed to occur, determine whether a third snapback event occurred after applying the third read voltage, and determine the logic state stored by the memory cell based on determining whether the first snapback event, the second snapback event, or the third snapback event occurred.

Some examples may further include determining that the third snapback event occurred, and performing a reprogram operation on the memory cell after determining the logic state stored by the memory cell based on determining that the third snapback event occurred.

Some examples may further include identifying that the logic state stored by the memory cell includes a first type based on determining that the third snapback event occurred, where performing the reprogram operation may be based on identifying that the logic state stored by the memory cell includes the first type.

Some examples may further include determining that the third snapback event failed to occur, and refraining from performing a reprogram operation on the memory cell based on determining that the third snapback event failed to occur.

Some examples may further include determining that the second snapback event occurred, and performing a reprogram operation on the memory cell based on determining that the second snapback event occurred, where determining the logic state stored by the memory cell may be based on determining that the second snapback event occurred.

Some examples may further include identifying that the logic state stored by the memory cell includes a first type that may be disturbed after a snapback event occurs based on determining that the second snapback event occurred, where performing the reprogram operation on the memory cell may be based on identifying that the logic state includes the first type.

Some examples may further include identifying that the logic state stored by the memory cell includes a second type that may be reinforced after a snapback event occurs based on determining that the first snapback event occurred.

Some examples may further include determining that the memory cell thresholds after applying the first read voltage, and determining that the first snapback event occurred based on determining that the memory cell thresholds after applying the first read voltage.

In some examples, the first polarity includes a negative polarity.

In some examples, the second magnitude may be greater than the first magnitude, where the third magnitude may be greater than the second magnitude.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of the memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
applying a first read voltage with a first polarity to a memory cell to determine a logic state stored by the memory cell configured to store three or more logic states;
determining whether a first snapback event occurred after applying the first read voltage;
applying a second read voltage with a second polarity different than the first polarity to the memory cell based at least in part on determining that the first snapback event failed to occur;
determining whether a second snapback event occurred after applying the second read voltage; and
determining the logic state stored by the memory cell from the three or more logic states based at least in part on determining whether the first snapback event or the second snapback event occurred.

2. The method of claim 1, further comprising:
applying a third read voltage with the first polarity and a magnitude greater than a magnitude of the second read voltage to the memory cell based at least in part on determining that the second snapback event failed to occur; and
determining whether a third snapback event occurred after applying the third read voltage, wherein determining the logic state stored by the memory cell is based at least in part on determining whether the third snapback event occurred.

3. A method, comprising:
applying a first read voltage with a first polarity to a memory cell to determine a logic state stored by the memory cell configured to store three or more logic states;
determining whether a first snapback event occurred after applying the first read voltage;
applying a second read voltage with a second polarity to the memory cell based at least in part on determining that the first snapback event failed to occur;
determining whether a second snapback event occurred after applying the second read voltage;
applying a third read voltage with the first polarity and a magnitude greater than a magnitude of the second read voltage to the memory cell based at least in part on determining that the second snapback event failed to occur;
determining whether a third snapback event occurred after applying the third read voltage;
determining the logic state stored by the memory cell based at least in part on determining whether the first snapback event, the second snapback event, or the third snapback event occurred;
determining that the third snapback event occurred; and
performing a reprogram operation on the memory cell after determining the logic state stored by the memory cell based at least in part on determining that the third snapback event occurred.

4. The method of claim 3, further comprising:
identifying that the logic state stored by the memory cell comprises a first type based at least in part on determining that the third snapback event occurred, wherein performing the reprogram operation is based at least in part on identifying that the logic state stored by the memory cell comprises the first type.

5. The method of claim 2, further comprising:
determining that the third snapback event failed to occur; and
refraining from performing a reprogram operation on the memory cell based at least in part on determining that the third snapback event failed to occur.

6. The method of claim 1, further comprising:
applying a third read voltage with the second polarity and a magnitude greater than a magnitude of the second read voltage to the memory cell based at least in part on determining that the second snapback event failed to occur; and
determining whether a third snapback event occurred after applying the third read voltage, wherein determining the logic state stored by the memory cell is based at least in part on determining whether the third snapback event occurred.

7. A method, comprising:
applying a first read voltage with a first polarity to a memory cell to determine a logic state stored by the memory cell configured to store three or more logic states;
determining whether a first snapback event occurred after applying the first read voltage;
applying a second read voltage with a second polarity to the memory cell based at least in part on determining that the first snapback event failed to occur;
determining whether a second snapback event occurred after applying the second read voltage;
applying a third read voltage with the second polarity and a magnitude greater than a magnitude of the second read voltage to the memory cell based at least in part on determining that the second snapback event failed to occur;
determining whether a third snapback event occurred after applying the third read voltage;
determining the logic state stored by the memory cell based at least in part on determining whether the first snapback event, the second snapback event, or the third snapback event occurred;
determining that the third snapback event occurred; and
performing a reprogram operation on the memory cell after determining the logic state stored by the memory cell based at least in part on determining that the third snapback event occurred.

8. The method of claim 7, further comprising:
identifying that the logic state stored by the memory cell comprises a first type based at least in part on determining that the third snapback event occurred, wherein performing the reprogram operation is based at least in part on identifying that the logic state stored by the memory cell comprises the first type.

9. The method of claim 6, further comprising:
determining that the third snapback event failed to occur; and
refraining from performing a reprogram operation on the memory cell based at least in part on determining that the third snapback event failed to occur.

10. The method of claim 1, further comprising:
identifying that the logic state stored by the memory cell comprises a first type that is disturbed after a snapback event occurs; and
performing a reprogram operation on the memory cell based at least in part on identifying that the logic state comprises the first type.

11. The method of claim 1, further comprising:
identifying that the logic state stored by the memory cell comprises a second type that is reinforced after a snapback event occurs based at least in part on determining that the first snapback event occurred.

12. The method of claim 1, further comprising:
determining that the memory cell thresholds after applying the first read voltage; and
determining that the first snapback event occurred based at least in part on determining that the memory cell thresholds after applying the first read voltage.

13. The method of claim 1, wherein the first polarity comprises a negative polarity and the second polarity comprises a positive polarity.

14. The method of claim 1, wherein a magnitude of the first read voltage is similar to a magnitude of the second read voltage.

15. An apparatus comprising:
a memory array comprising a memory cell; and
a control component coupled with the memory array, the control component configured to cause the apparatus to:
apply a first read voltage with a first polarity to the memory cell to determine a logic state stored by the memory cell configured to store three or more logic states;
determine whether a first snapback event occurred after applying the first read voltage;
apply a second read voltage with a second polarity different than the first polarity to the memory cell based at least in part on determining that the first snapback event failed to occur;

determine whether a second snapback event occurred after applying the second read voltage; and determine the logic state stored by the memory cell from the three or more logic states based at least in part on determining whether the first snapback event or the second snapback event occurred.

16. The apparatus of claim 15, wherein the control component is further configured to cause the apparatus to:

apply a third read voltage with the first polarity and a magnitude greater than a magnitude of the second read voltage to the memory cell based at least in part on determining that the second snapback event failed to occur; and determine whether a third snapback event occurred after applying the third read voltage, wherein determining the logic state stored by the memory cell is based at least in part on determining whether the third snapback event occurred.

17. An apparatus comprising:

a memory array comprising a memory cell; and a control component coupled with the memory array, the control component configured to cause the apparatus to:

apply a first read voltage with a first polarity to the memory cell to determine a logic state stored by the memory cell configured to store three or more logic states;

determine whether a first snapback event occurred after applying the first read voltage;

apply a second read voltage with a second polarity to the memory cell based at least in part on determining that the first snapback event failed to occur;

determine whether a second snapback event occurred after applying the second read voltage;

apply a third read voltage with the first polarity and a magnitude greater than a magnitude of the second read voltage to the memory cell based at least in part on determining that the second snapback event failed to occur;

determine whether a third snapback event occurred after applying the third read voltage;

determining the logic state stored by the memory cell based at least in part on determining whether the first snapback event, the second snapback event, or the third snapback event occurred;

determine that the third snapback event occurred; and perform a reprogram operation on the memory cell after determining the logic state stored by the memory cell based at least in part on determining that the third snapback event occurred.

18. The apparatus of claim 15, wherein the control component is further configured to cause the apparatus to:

apply a third read voltage with the second polarity and a magnitude greater than a magnitude of the second read voltage to the memory cell based at least in part on determining that the second snapback event failed to occur; and determine whether a third snapback event occurred after applying the third read voltage, wherein determining the logic state stored by the memory cell is based at least in part on determining whether the third snapback event occurred.

19. A non-transitory computer-readable medium storing code comprising instructions which, when executed by a processor of an electronic device, cause the electronic device to:

apply a first read voltage with a first polarity to a memory cell to determine a logic state stored by the memory cell configured to store three or more logic states;

determine whether a first snapback event occurred after applying the first read voltage;

apply a second read voltage with a second polarity different than the first polarity to the memory cell based at least in part on determining that the first snapback event failed to occur;

determine whether a second snapback event occurred after applying the second read voltage; and determine the logic state stored by the memory cell from the three or more logic states based at least in part on determining whether the second snapback event occurred.

20. The non-transitory computer-readable medium of claim 19, wherein the instructions, when executed by the processor of the electronic device, further cause the electronic device to:

apply a third read voltage with the first polarity and a magnitude greater than a magnitude of the second read voltage to the memory cell based at least in part on determining that the second snapback event failed to occur; and determine whether a third snapback event occurred after applying the third read voltage, wherein determining the logic state stored by the memory cell is based at least in part on determining whether the third snapback event occurred.

21. The non-transitory computer-readable medium of claim 19, wherein the instructions, when executed by the processor of the electronic device, further cause the electronic device to:

apply a third read voltage with the second polarity and a magnitude greater than a magnitude of the second read voltage to the memory cell based at least in part on determining that the second snapback event failed to occur; and determine whether a third snapback event occurred after applying the third read voltage, wherein determining the logic state stored by the memory cell is based at least in part on determining whether the third snapback event occurred.

22. The method of claim 1, further comprising:

applying a third read voltage with the first polarity or the second polarity to the memory cell based at least in part on determining that the second snapback event failed to occur; and determining the logic state stored by the memory cell based at least in part on applying the third read voltage.

* * * * *